US010001552B2

United States Patent
Panchawagh et al.

(10) Patent No.: US 10,001,552 B2
(45) Date of Patent: Jun. 19, 2018

(54) THREE-PORT PIEZOELECTRIC ULTRASONIC TRANSDUCER

(71) Applicant: QUALCOMM Incorporated, San Diego, CA (US)

(72) Inventors: Hrishikesh Vijaykumar Panchawagh, San Jose, CA (US); Hao-Yen Tang, Berkeley, CA (US); Yipeng Lu, Davis, CA (US); Kostadin Dimitrov Djordjev, San Jose, CA (US); Suryaprakash Ganti, Los Altos, CA (US); David William Burns, San Jose, CA (US); Ravindra Vaman Shenoy, Dublin, CA (US); Jon Bradley Lasiter, Stockton, CA (US); Nai-Kuei Kuo, San Jose, CA (US); Firas Sammoura, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 484 days.

(21) Appl. No.: 14/883,583

(22) Filed: Oct. 14, 2015

(65) Prior Publication Data
US 2016/0107194 A1    Apr. 21, 2016

Related U.S. Application Data

(60) Provisional application No. 62/064,416, filed on Oct. 15, 2014, provisional application No. 62/064,417, (Continued)

(51) Int. Cl.
*H01L 41/09* (2006.01)
*H01L 41/113* (2006.01)
(Continued)

(52) U.S. Cl.
CPC .......... *G01S 7/5208* (2013.01); *B06B 1/0207* (2013.01); *B06B 1/0607* (2013.01);
(Continued)

(58) Field of Classification Search
CPC ........ G01S 7/5208; G01S 7/521; G01S 15/04; G01S 15/89; G01S 15/8915;
(Continued)

(56) References Cited

U.S. PATENT DOCUMENTS 3,800,270 A    3/1974   Bailey
4,307,613 A    12/1981  Fox
(Continued)

FOREIGN PATENT DOCUMENTS

DE    3940808 A1    6/1991
GB    2511556 A     9/2014
(Continued)

OTHER PUBLICATIONS

International Preliminary Report on Patentability—PCT/US2015/055825—ISA/EPO—Feb. 3, 2017.
(Continued)

*Primary Examiner* — Thomas Dougherty
(74) *Attorney, Agent, or Firm* — Weaver Austin Villeneuve & Sampson LLP—Qual

(57) ABSTRACT

A piezoelectric micromechanical ultrasonic transducer (PMUT) includes a diaphragm disposed over a cavity, the diaphragm including a piezoelectric layer stack including a piezoelectric layer, a first electrode electrically coupled with transceiver circuitry, and a second electrode electrically coupled with the transceiver circuitry. The first electrode may be disposed in a first portion of the diaphragm, and the second electrode may be disposed in a second, separate, portion of the diaphragm. Each of the first and the second electrode is disposed on or proximate to a first surface of the
(Continued)

piezoelectric layer, the first surface being opposite from the cavity. The PMUT is configured to transmit first ultrasonic signals by way of the first electrode during a first time period and to receive second ultrasonic signals by way of the second electrode during a second time period, the first time period and the second time period being at least partially overlapping.

40 Claims, 21 Drawing Sheets

Related U.S. Application Data filed on Oct. 15, 2014, provisional application No. 62/064,418, filed on Oct. 15, 2014.

(51) Int. Cl.

| | |
|---|---|
| *B06B 1/06* | (2006.01) |
| *G01S 7/52* | (2006.01) |
| *H01L 41/047* | (2006.01) |
| *G10K 11/34* | (2006.01) |
| *G06F 3/041* | (2006.01) |
| *G06F 3/043* | (2006.01) |
| *G06K 9/00* | (2006.01) |
| *G10K 11/26* | (2006.01) |
| *G01S 7/521* | (2006.01) |
| *G01S 15/04* | (2006.01) |
| *G01S 15/89* | (2006.01) |
| *H01L 41/08* | (2006.01) |
| *B06B 1/02* | (2006.01) |

(52) U.S. Cl.
CPC ......... *B06B 1/0644* (2013.01); *B06B 1/0666* (2013.01); *G01S 7/521* (2013.01); *G01S 15/04* (2013.01); *G01S 15/89* (2013.01); *G01S 15/8915* (2013.01); *G06F 3/0412* (2013.01); *G06F 3/0416* (2013.01); *G06F 3/0436* (2013.01); *G06K 9/0002* (2013.01); *G06K 9/00335* (2013.01); *G10K 11/26* (2013.01); *G10K 11/34* (2013.01); *G10K 11/346* (2013.01); *H01L 41/047* (2013.01); *H01L 41/08* (2013.01); *B06B 2201/20* (2013.01); *B06B 2201/55* (2013.01); *G06F 2203/04101* (2013.01); *G10K 11/341* (2013.01)

(58) Field of Classification Search
CPC ... B06B 1/0207; B06B 1/0607; B06B 1/0644; B06B 1/0666; G06F 3/0412; G06F 3/0416; G06F 3/0436; G06K 9/0002; G06K 9/00335; G10K 11/26; G10K 11/34; G10K 11/346; H01L 41/047; H01L 41/08
USPC .......................... 310/317–319, 322, 324, 334
See application file for complete search history.

(56) References Cited

U.S. PATENT DOCUMENTS

| | | | |
|---|---|---|---|
| 4,523,471 A | 6/1985 | Lee | |
| 5,744,898 A | 4/1998 | Smith et al. | |
| 6,383,141 B1 | 5/2002 | Itoi | |
| 6,736,779 B1 | 5/2004 | Sano et al. | |
| 8,203,912 B2 | 6/2012 | Roest et al. | |
| 8,760,971 B2 | 6/2014 | Karl | |
| 8,958,610 B2 | 2/2015 | McNulty | |
| 2004/0267134 A1 | 12/2004 | Hossack et al. | |
| 2005/0023937 A1 | 2/2005 | Sashida et al. | |
| 2005/0041498 A1 | 2/2005 | Resta et al. | |
| 2005/0057284 A1 | 3/2005 | Wodnicki | |
| 2005/0075572 A1 | 4/2005 | Mills et al. | |
| 2005/0146247 A1 | 7/2005 | Fisher et al. | |
| 2005/0219212 A1 | 10/2005 | Koll et al. | |
| 2006/0164919 A1 | 7/2006 | Watanabe et al. | |
| 2008/0110266 A1 | 5/2008 | Randall et al. | |
| 2008/0122317 A1 | 5/2008 | Fazzio et al. | |
| 2008/0258580 A1 | 10/2008 | Schneider et al. | |
| 2008/0309200 A1 | 12/2008 | Melandso et al. | |
| 2009/0204001 A1 | 8/2009 | Ona et al. | |
| 2010/0106431 A1 | 4/2010 | Baba et al. | |
| 2010/0168583 A1 | 7/2010 | Dausch et al. | |
| 2011/0215150 A1 | 9/2011 | Schneider et al. | |
| 2012/0188849 A1 | 7/2012 | Matsuda et al. | |
| 2012/0206014 A1 | 8/2012 | Bibl et al. | |
| 2012/0245408 A1 | 9/2012 | Shen et al. | |
| 2013/0134838 A1 | 5/2013 | Yun et al. | |
| 2013/0258805 A1 | 10/2013 | Hansen et al. | |
| 2013/0286778 A1 | 10/2013 | Kisner et al. | |
| 2013/0293065 A1 | 11/2013 | Hajati et al. | |
| 2014/0219521 A1 | 8/2014 | Schmitt et al. | |
| 2014/0232241 A1 | 8/2014 | Hajati | |
| 2014/0243676 A1 | 8/2014 | Cogan et al. | |
| 2014/0354608 A1 | 12/2014 | Kitchens, II et al. | |
| 2015/0020608 A1 | 1/2015 | Chevrier et al. | |
| 2015/0087991 A1 | 3/2015 | Chen et al. | |
| 2015/0165479 A1 | 6/2015 | Lasiter et al. | |
| 2015/0169136 A1 | 6/2015 | Ganti et al. | |
| 2015/0198699 A1 | 7/2015 | Kuo et al. | |
| 2015/0346903 A1 | 12/2015 | O'Connor | |
| 2015/0357375 A1 | 12/2015 | Tsai et al. | |
| 2016/0131747 A1 | 5/2016 | Tang et al. | |
| 2016/0132187 A1* | 5/2016 | Lu ......................... | H01L 41/047 345/177 |
| 2017/0110504 A1 | 4/2017 | Panchawagh et al. | |

FOREIGN PATENT DOCUMENTS

| | | | |
|---|---|---|---|
| JP | 2013135793 A1 | 7/2013 | |
| WO | 2014108960 A1 | 7/2014 | |
| WO | WO-2015086413 A1 | 6/2015 | |
| WO | 2016061406 A1 | 4/2016 | |
| WO | 2016061410 A1 | 4/2016 | |
| WO | 2016061412 A1 | 4/2016 | |
| WO | PCT/US16/57104 | 10/2016 | |
| WO | WO 2017066612 A1 | 4/2017 | |

OTHER PUBLICATIONS

International Preliminary Report on Patentability—PCT/US2015/055827—ISA/EPO—Feb. 3, 2017.
International Preliminary Report on Patentability—PCT/US2015/055821—ISA/EPO—Feb. 3, 2017.
International Search Report and Written Opinion—PCT/US2016/57104—ISA/EPO—Jan. 23, 2017.
U.S. Office Action dated Sep. 1, 2017, issued in U.S. Appl. No. 14/883,585.
U.S. Final Office Action dated Oct. 18, 2017, issued in U.S. Appl. No. 14/883,586.
International Search Report and Written Opinion—PCT/US2015/055825—ISA/EPO—Feb. 8, 2016.
Second Written Opinion of the International Preliminary Examining Authority—PCT/US2015/055825—ISA/EPO—Sep. 26, 2016.
U.S. Appl. No. 15/292,057, filed Oct. 12, 2016, Panchawagh; Hrishikesh Vijaykumar et al.
International Search Report and Written Opinion PCT/US2015/055827—ISA/EPO—Feb. 4, 2016.
Second Written Opinion of the International Preliminary Examining Authority—PCT/US2015/055827—ISA/EPO—Sep. 26, 2016.
International Search Report and Written Opinion—PCT/US2015/055821—ISA/EPO—Feb. 4, 2016.
Second Written Opinion of the International Preliminary Examining Authority—PCT/US2015/055821—ISA/EPO—Sep. 26, 2016.
U.S. Office Action dated May 3, 2017, issued in U.S. Appl. No. 14/883,586.

(56) References Cited

OTHER PUBLICATIONS

U.S. Corrected Notice of Allowance dated Feb. 9, 2018 issued in U.S. Appl. No. 14/883,585.
U.S. Supplemental Notice of Allowance dated Jan. 29, 2018 issued in U.S. Appl. No. 14/883,585.
U.S. Notice of Allowance dated Jan. 16, 2018 issued in U.S. Appl. No. 14/883,585.
U.S. Office Action dated Jan. 3, 2018 issued in U.S. Appl. No. 14/883,586.

* cited by examiner

THREE-PORT PIEZOELECTRIC ULTRASONIC TRANSDUCER

CROSS-REFERENCE TO RELATED APPLICATIONS

This disclosure claims priority to U.S. Provisional Patent Application No. 62/064,416, filed on Oct. 15, 2014, entitled "THREE-PORT PIEZOELECTRIC ULTRASONIC TRANSDUCER," to Provisional Patent Application No. 62/064,417, filed on Oct. 15, 2014 and entitled "ACTIVE BEAM-FORMING TECHNIQUE FOR PIEZOELECTRIC ULTRASONIC TRANSDUCER ARRAY," to Provisional Patent Application No. 62/064,418, filed on Oct. 15, 2014 and entitled "SUPERPIXEL ARRAY OF PIEZOELECTRIC ULTRASONIC TRANSDUCERS FOR 2-D BEAMFORMING," which are hereby incorporated by reference. Provisional Patent Application No. 62/241,651, filed on Oct. 14, 2015 and entitled "INTEGRATED PIEZOELECTRIC MICROMECHANICAL ULTRASONIC TRANSDUCER PIXEL AND READOUT," is hereby incorporated by reference.

TECHNICAL FIELD

This disclosure relates to piezoelectric transducers and to techniques for fabricating and operating piezoelectric transducers, and more particularly to a piezoelectric ultrasonic transducer suitable for use in an electronic sensor array or interactive display for biometric sensing, imaging, and touch or gesture recognition.

DESCRIPTION OF THE RELATED TECHNOLOGY

Thin film piezoelectric acoustic transducers are attractive candidates for numerous applications including biometric sensors such as fingerprint sensors, gesture detection, microphones and speakers, ultrasonic imaging, and chemical sensors. Such transducers may include piezoelectric micromechanical ultrasonic transducers (PMUTs) configured as a multilayer stack that includes a piezoelectric layer stack and a mechanical layer disposed over a cavity. The piezoelectric layer stack may include a layer of piezoelectric material. On or proximate to each of an upper and a lower surface of the piezoelectric layer, a respective upper and lower electrode layer may be disposed. The electrode layers may be patterned or unpatterned.

Referring to FIG. 1A, a piezoelectric ultrasonic transducer 100 may be configured such that it includes a piezoelectric layer stack 110 and a mechanical layer 130 disposed so as to form a diaphragm supported by the anchor structure 170 over a cavity 120. The piezoelectric layer stack 110 includes a piezoelectric layer 115 with associated lower electrode 112 and upper electrode 114 disposed, respectively, below and above the piezoelectric layer 115. The cavity 120 may be formed in a semiconductor substrate 160 such as, for example, a silicon wafer, a silicon-on-insulator (SOI) wafer, or as a glass or polymer substrate with thin film transistor (TFT) circuitry.

Referring now to FIG. 1B, during operation, the piezoelectric layer stack 110 and mechanical layer 130 may be caused to vibrate in response to a time-varying excitation voltage applied across lower electrode 112 and upper electrode 114 by transceiver circuitry 1010. As a result, one or more ultrasonic pressure waves 122 having frequencies in, for example, an ultrasonic frequency band, may be propagated into a propagation medium 124. In some implementations, the propagation medium 124 may include air, a platen, a cover glass, a device enclosure, or an acoustic coupling or matching layer. The piezoelectric layer stack 110 may likewise receive reflected ultrasonic pressure waves from an object in the propagation medium, and convert the received ultrasonic pressure waves into electrical signals that may be read by transceiver circuitry 1010.

SUMMARY

The systems, methods and devices of this disclosure each have several innovative aspects, no single one of which is solely responsible for the desirable attributes disclosed herein.

One innovative aspect of the subject matter described in this disclosure relates to a method that includes: transmitting, during a first time period, responsive to signals from transceiver circuitry, first ultrasonic signals by way of a first electrode of a piezoelectric micromechanical ultrasonic transducer (PMUT), the PMUT including a diaphragm disposed over a cavity, the diaphragm including a piezoelectric layer stack including a piezoelectric layer, the first electrode and a second electrode, each of the first electrode and the second electrode being electrically coupled with the transceiver circuitry; and receiving, during a second time period, second ultrasonic signals by way of the second electrode. The first time period and the second time period are at least partially overlapping.

In some examples, the PMUT may be configured to simultaneously transmit first ultrasonic signals by way of the first electrode and to receive second ultrasonic signals by way of the second electrode.

In some examples, each of the first electrode and the second electrode is disposed on or proximate to a first surface of the piezoelectric layer, the first surface being opposite from the cavity. The first electrode may be disposed in an inner portion of the diaphragm and the second electrode is disposed in an outer portion of the diaphragm, the outer portion being proximal to a wall of the cavity and between the wall and the first electrode. In some examples, a portion of the second electrode may extend beyond the wall of the cavity. In some examples, the diaphragm includes a third electrode, the third electrode being disposed between the piezoelectric layer and the cavity. In some examples, the third electrode may be configured as a reference electrode in common with each of the first electrode and the second electrode. In some examples, a voltage of the reference electrode may be clamped to ground or other reference voltage.

In some examples, the diaphragm may be supported by an anchor structure and may extend over the cavity, the diaphragm being configured to undergo one or both of flexural motion and vibration and operate in a first flexural mode when the PMUT receives or transmits ultrasonic signals. In some examples, in the first flexural mode, each of the first and second electrodes may experience a respective first and second oscillating load cycle that includes alternating periods of tensile and compressive stress. In some examples, the first and second oscillating load cycles may be approximately in phase. In some examples, the first and second oscillating load cycles may be out of phase. In some examples, the first and second oscillating load cycles may be 180° out of phase.

In some examples, the second electrode may be configured to be in a transmit mode during the first time period and in a receive mode during the second time period.

According to some implementations, an apparatus includes a piezoelectric micromechanical ultrasonic transducer (PMUT), the PMUT including: a diaphragm disposed over a cavity, the diaphragm including a piezoelectric layer stack including a piezoelectric layer, a first electrode electrically coupled with transceiver circuitry, and a second electrode electrically coupled with the transceiver circuitry. The first electrode is disposed in a first portion of the diaphragm, and the second electrode is disposed in a second portion of the diaphragm, the first portion being separated from the first portion. Each of the first electrode and the second electrode is disposed on or proximate to a first surface of the piezoelectric layer, the first surface being opposite from the cavity. The PMUT is configured to transmit first ultrasonic signals by way of the first electrode during a first time period and to receive second ultrasonic signals by way of the second electrode during a second time period, the first time period and the second time period being at least partially overlapping.

In some examples, the second electrode may be disposed proximal to a wall of the cavity and between the wall and the first electrode. In some examples, a portion of the second electrode may extend beyond the wall of the cavity.

In some examples, the PMUT may be configured to simultaneously transmit first ultrasonic signals by way of the first electrode and to receive second ultrasonic signals by way of the second electrode.

In some examples, the diaphragm may include a third electrode, the third electrode being disposed between the piezoelectric layer and the cavity. In some examples, the first electrode is a transmit electrode, the second electrode is a receive electrode and the third electrode is configured as a reference electrode in common with each of the transmit electrode and the receive electrode.

In some examples, the diaphragm may include a mechanical layer, the mechanical layer being positioned between the piezoelectric layer stack and the cavity or positioned on a side of the piezoelectric layer stack opposite the cavity.

In some examples, the apparatus may further include an anchor structure disposed over a substrate, wherein the diaphragm is supported by the anchor structure and extends over the cavity, the diaphragm being configured to undergo one or both of flexural motion and vibration when the PMUT receives or transmits ultrasonic signals. In some examples, the diaphragm may be configured as an elongated rectangle having a longitudinal dimension of length L and a width of W, L being at least two times W. In some examples, the anchor structure may support the diaphragm at a first discrete location that is proximal to a proximal end of the longitudinal dimension and at a second discrete location of the diaphragm that is proximal to a distal end of the longitudinal dimension. In some examples, the anchor structure may support the diaphragm in a central portion of the diaphragm. In some examples, the anchor structure may support the diaphragm in a peripheral region of the diaphragm. In some examples, the diaphragm may be substantially circular. In some examples, the anchor structure may support the diaphragm in a central portion of the diaphragm.

In some examples, the cavity may be formed by removing a sacrificial material through at least one release hole. In some examples, the release hole may be disposed through the diaphragm.

In some examples, the first electrode and the second electrode may be approximately coplanar.

According to some implementations, an apparatus includes an array of piezoelectric micromechanical ultrasonic transducer (PMUT) sensors and an acoustic coupling medium. At least one PMUT includes a diaphragm disposed over a cavity, the diaphragm including a piezoelectric layer stack including a piezoelectric layer, a first electrode electrically coupled with a transceiver circuitry, and a second electrode electrically coupled with the transceiver circuitry. The first electrode is disposed in a first portion of the diaphragm, and the second electrode is disposed in a second portion of the diaphragm, the first portion being separated from the second portion. Each of the first electrode and the second electrode is disposed on or proximate to a first surface of the piezoelectric layer, the first surface being opposite from the cavity. The PMUT is configured to transmit first ultrasonic signals by way of the first electrode during a first time period and to receive second ultrasonic signals by way of the second electrode during a second time period, the first time period and the second time period being at least partially overlapping. The acoustic coupling medium is disposed above the piezoelectric layer stack. The PMUT is configured to receive or transmit ultrasonic signals through the acoustic coupling medium.

In some examples, the array of PMUT sensors may include a platen, wherein the acoustic coupling medium is disposed between the PMUT sensors and the platen.

In some examples, the PMUT may be configured to simultaneously transmit first ultrasonic signals by way of the first electrode and to receive second ultrasonic signals by way of the second electrode.

In some examples, the diaphragm may include a third electrode, the third electrode being disposed between the piezoelectric layer and the cavity. In some examples, the first electrode may be a transmit electrode, the second electrode may be a receive electrode and the third electrode may be configured as a reference electrode in common with each of the transmit electrode and the receive electrode.

In some examples, the array of PMUT sensors may be configured as an ultrasonic fingerprint sensor array.

According to some implementations, a non-transitory computer readable medium has software stored thereon, the software including instructions for causing an apparatus to: transmit, during a first time period, responsive to signals from transceiver circuitry, first ultrasonic signals by way of a first electrode of a piezoelectric micromechanical ultrasonic transducer (PMUT), the PMUT including a diaphragm disposed over a cavity, the diaphragm including a piezoelectric layer stack including a piezoelectric layer, the first electrode and a second electrode, each of the first electrode and the second electrode being electrically coupled with the transceiver circuitry; and receive, during a second time period, second ultrasonic signals by way of the second electrode. The first time period and the second time period are at least partially overlapping.

BRIEF DESCRIPTION OF THE DRAWINGS

Details of one or more implementations of the subject matter described in this specification are set forth in this disclosure and the accompanying drawings. Other features, aspects, and advantages will become apparent from a review of the disclosure. Note that the relative dimensions of the drawings and other diagrams of this disclosure may not be drawn to scale. The sizes, thicknesses, arrangements, materials, etc., shown and described in this disclosure are made only by way of example and should not be construed as limiting. Like reference numbers and designations in the various drawings indicate like elements.

DETAILED DESCRIPTION

Figure 1A:
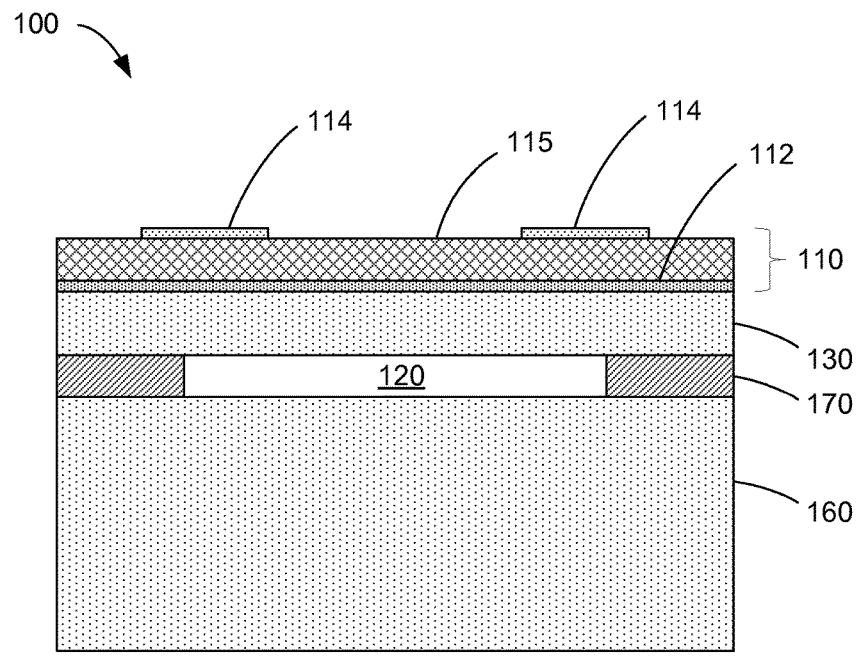
FIGS. 1A-1B illustrate an example of a piezoelectric ultrasonic transducer.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that includes an ultrasonic sensor or emitter. For example, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, handwriting digitizers, fingerprint detectors, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also may be used in applications such as, but not limited to, electronic switching devices, radio frequency filters, sensors, accelerometers, gyroscopes, motion-sensing devices, fingerprint sensing devices, gesture recognition, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The systems, methods and devices of the disclosure each have several innovative aspects, no single one of which is solely responsible for the desirable attributes disclosed herein. The subject matter described in this disclosure can be implemented in a piezoelectric micromechanical ultrasonic transducer (PMUT) certain aspects of which have been described in U.S. patent application Ser. No. 14/569,280, filed on Dec. 12, 2014 and entitled "MICROMECHANICAL ULTRASONIC TRANSDUCERS AND DISPLAY," and in U.S. patent application Ser. No. 14/569,256, filed on Dec. 12, 2014 and entitled "PIEZOELECTRIC ULTRASONIC TRANSDUCER AND PROCESS," each assigned to the assignee of the present invention and hereby incorporated by reference into the present application in its entirety for all purposes. One innovative aspect of the subject matter described in this disclosure can be implemented in a PMUT configured as a multilayer stack that includes a multilayer diaphragm structure that includes a piezoelectric layer stack and three or more electrodes. The three electrodes may include a separate electrode for each of transmitting signals to and receiving signals from associated transceiver circuitry, and a common reference or ground electrode. The arrangement allows transmit and receive timings to be independent of each other, thereby enabling, for example, simultaneous transmission and reception of ultrasonic waves. In some implementations, transmit and receive electrodes may be formed in the same electrode layer.

In some implementations, each of the transmit electrode and the receive electrode may experience a differing orientation of mechanical stress or strain during bending. For example, where one electrode is disposed proximate to an interior region of the diaphragm and the other electrode is disposed proximate to an outer region of the diaphragm, a first portion of the piezoelectric layer proximate to the first electrode may be under tension at the same time that a second portion of the piezoelectric layer proximate to the second electrode is under compression. A boundary or boundary region, that may be referred to as an "inflection zone" may be located between such portions of piezoelectric layer. In typical two-port PMUT structures, in order to operate efficiently, a transmit/receive electrode may be positioned either to cover the tensile strain region of the piezoelectric layer or the compressive strain region of the piezoelectric layer, but not both. Thus, a portion of the PMUT device diaphragm is not used in typical two-port implementations. In contrast, in implementations of the three-port PMUT structure described hereinbelow, where a transmit electrode and a separate receive electrode are positioned on opposite sides of the inflection zone, a greater portion of the PMUT device diaphragm is used, thereby improving efficiency of the device. Moreover, the disclosed techniques may provide for electrical separation between the two electrodes such that transmit circuitry may be connected to the transmit electrode and separate receive circuitry may be connected to the receive electrode, removing the need for a time separation between operation in a transmit mode and operation in a receive mode.

One innovative aspect of the subject matter described in this disclosure can be implemented in an apparatus that includes a one- or two-dimensional array of three-port piezoelectric micromechanical ultrasonic transducer (PMUT) elements positioned below, beside, with, on, or above a backplane of a display or an ultrasonic fingerprint sensor array.

In some implementations, the PMUT array may be configurable to operate in modes corresponding to multiple frequency ranges. In some implementations, for example, the PMUT array may be configurable to operate in a low-frequency mode corresponding to a low-frequency range (e.g., 50 kHz to 200 kHz) or in a high-frequency mode corresponding to a high-frequency range (e.g., 1 MHz to 25 MHz). When operating in the high-frequency mode, an apparatus may be capable of imaging at relatively higher resolution. Accordingly, the apparatus may be capable of detecting touch, fingerprint, stylus, and biometric information from an object such as a finger placed on the surface of the display or sensor array. Such a high-frequency mode may be referred to herein as a fingerprint sensor mode.

When operating in the low-frequency mode, the apparatus may be capable of emitting sound waves that are capable of relatively greater penetration into air than when the apparatus is operating in the high-frequency mode. Such lower-frequency sound waves may be transmitted through various overlying layers including a cover glass, a touchscreen, a display array, a backlight, a housing or enclosure, or other layers positioned between an ultrasonic transmitter and a display or sensor surface. In some implementations, a port may be opened through one or more of the overlying layers to optimize acoustic coupling from the PMUT array into air. The lower-frequency sound waves may be transmitted through the air above the display or sensor surface, reflected from one or more objects near the surface, transmitted through the air and back through the overlying layers, and detected by an ultrasonic receiver. Accordingly, when operating in the low-frequency mode, the apparatus may be capable of operating in a gesture detection mode, wherein free-space gestures near but not necessarily touching the display may be detected.

Alternatively, or additionally, in some implementations, the PMUT array may be configurable to operate in a medium-frequency mode corresponding to a frequency range between the low-frequency range and the high-frequency range (e.g., about 200 kHz to about 1 MHz). When operating in the medium-frequency mode, the apparatus may be capable of providing touch sensor functionality, although with somewhat less resolution than the high-frequency mode.

The PMUT array may be addressable for wavefront beam forming, beam steering, receive-side beam forming, and/or selective readout of returned signals. For example, individual columns, rows, sensor pixels and/or groups of sensor pixels may be separately addressable. A control system may control an array of transmitters to produce wavefronts of a particular shape, such as planar, circular or cylindrical wavefronts. The control system may control the magnitude and/or phase of the array of transmitters to produce constructive or destructive interference in desired locations. For example, the control system may control the magnitude and/or phase of the array of transmitters to produce constructive interference in one or more locations in which a touch or gesture has been detected or is likely to be detected.

In some implementations, PMUT devices may be co-fabricated with thin-film transistor (TFT) circuitry on the same substrate, which may be silicon, glass or plastic substrate in some examples. The TFT substrate may include row and column addressing electronics, multiplexers, local amplification stages and control circuitry. In some implementations, an interface circuit including a driver stage and a sense stage may be used to excite a PMUT device and detect responses from the same device. In other implementations, a first PMUT device may serve as an acoustic or ultrasonic transmitter and a second PMUT device may serve as an acoustic or ultrasonic receiver. In some configurations, different PMUT devices may be capable of low- and high-frequency operation (e.g. for gestures and for fingerprint detection). In other configurations, the same PMUT device may be used for low- and high-frequency operation. In some implementations, the PMUT may be fabricated using a silicon wafer with active silicon circuits fabricated in the silicon wafer. The active silicon circuits may include electronics for the functioning of the PMUT or PMUT array.

Figure 2A:
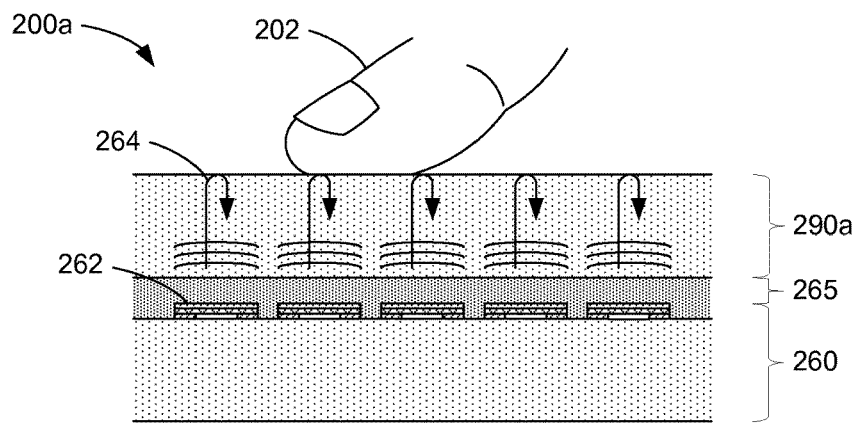
FIGS. 2A-2C illustrate cross-sectional views of various configurations of PMUT ultrasonic sensor arrays.
Figure 2B:
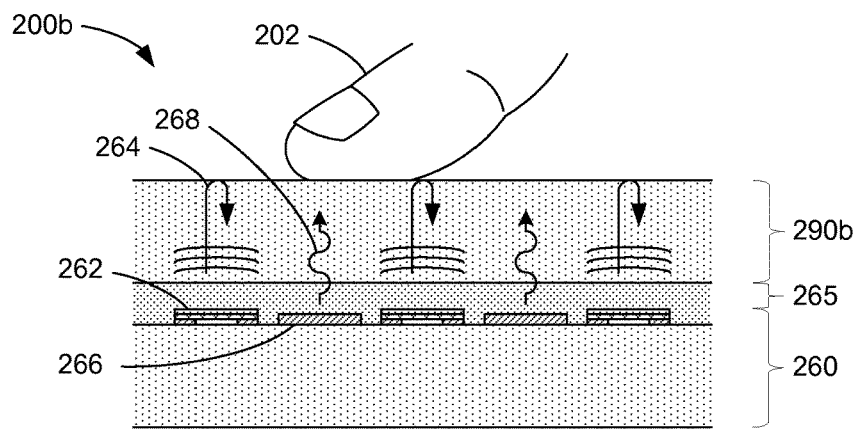
Figure 2C:
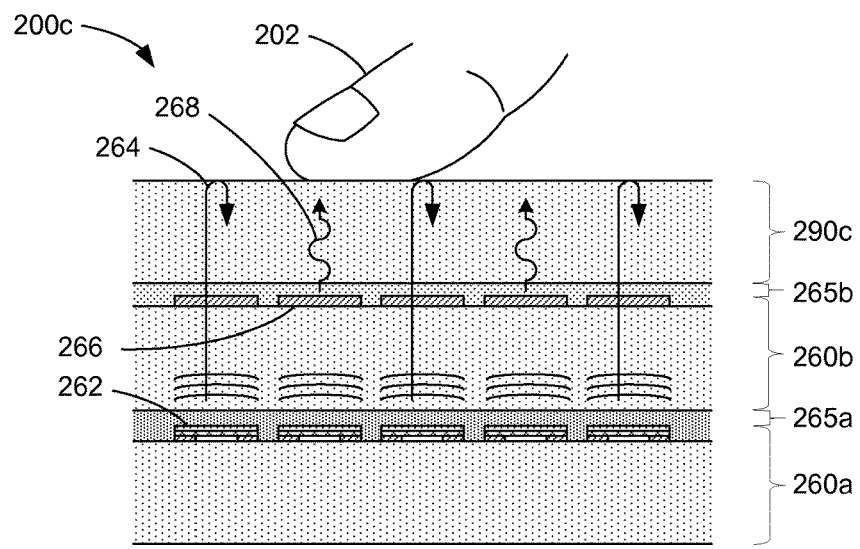

In some implementations, the PMUT array may be configured as an ultrasonic sensor array. FIGS. 2A-2C illustrate cross-sectional views of various configurations of PMUT ultrasonic sensor arrays. FIG. 2A depicts an ultrasonic sensor array 200a with PMUTs as transmitting and receiving elements that may be used, for example, as an ultrasonic fingerprint sensor, an ultrasonic touchpad, or an ultrasonic imager. PMUT sensor elements 262 on a PMUT sensor array substrate 260 may emit and detect ultrasonic waves. As illustrated, an ultrasonic wave 264 may be transmitted from at least one PMUT sensor element 262. The ultrasonic wave 264 may travel through an acoustic coupling medium 265 and a platen 290a towards an object 202 such as a finger or a stylus positioned on an outer surface of the platen 290a. A portion of the ultrasonic wave 264 may be transmitted through the platen 290a and into the object 202, while a second portion is reflected from the surface of platen 290a back towards the sensor element 262. The amplitude of the reflected wave may depend in part on the acoustic properties of the object 202. The reflected wave may be detected by the sensor elements 262, from which an image of the object 202 may be acquired. For example, with sensor arrays having a pitch of about 50 microns (about 500 pixels per inch), ridges and valleys of a fingerprint may be detected. An acoustic coupling medium 265 such as an adhesive, gel, a compliant layer or other acoustic coupling material may be provided to improve coupling between an array of PMUT sensor elements 262 disposed on the sensor array substrate 260 and the platen 290a. The acoustic coupling medium 265 may aid in the transmission of ultrasonic waves to and from the sensor elements 262. The platen 290a may include, for example, a layer of glass, plastic, sapphire, metal, metal alloy, or other platen material. An acoustic impedance matching layer (not shown) may be disposed on an outer surface of the platen 290a. The platen 290a may include a coating (not shown) on the outer surface.

FIG. 2B depicts an ultrasonic sensor and display array 200b with PMUT sensor elements 262 and display pixels 266 co-fabricated on a sensor and display substrate 260. The sensor elements 262 and display pixels 266 may be collocated in each cell of an array of cells. In some implementations, the sensor element 262 and the display pixel 266 may be fabricated side-by-side within the same cell. In some implementations, part or all of the sensor element 262 may be fabricated above or below the display pixel 266. Platen 290b may be positioned over the sensor elements 262 and the display pixels 266 and may function as or include a cover lens or cover glass. The cover glass may include one or more layers of materials such as glass, plastic or sapphire, and may include provisions for a capacitive touchscreen. An acoustic impedance matching layer or coating (not shown) may be disposed on an outer surface of the platen 290b. Ultrasonic waves 264 may be transmitted and received from one or more sensor elements 262 to provide imaging capability for an object 202 such as a stylus or a finger placed on the cover glass 290b. The cover glass 290b is substantially transparent to allow optical light from the array of display pixels 266 to be viewed by a user through the cover glass 290b. The user may choose to touch a portion of the cover glass 290b, and that touch may be detected by the ultrasonic sensor array. Biometric information such as fingerprint information may be acquired, for example, when a user touches the surface of the cover glass 290b. An acoustic coupling medium 265 such as an adhesive, gel, or other acoustic coupling material may be provided to improve acoustic, optical and mechanical coupling between the sensor array substrate 260 and the cover glass. In some implementations, the coupling medium 265 may be a liquid crystal material that may serve as part of a liquid crystal display (LCD). In LCD implementations, a backlight (not shown) may be optically coupled to the sensor and display substrate 260. In some implementations, the display pixels 266 may be part of an amorphous light-emitting diode (AMOLED) display with light-emitting display pixels. In some implementations, the ultrasonic sensor and display array 200b may be used for display purposes and for touch, stylus or fingerprint detection.

FIG. 2C depicts an ultrasonic sensor and display array 200c with a sensor array substrate 260a positioned behind a display array substrate 260b. An acoustic coupling medium 265a may be used to acoustically couple the sensor array substrate 260a to the display array substrate 260b. An optical and acoustic coupling medium 265b may be used to optically and acoustically couple the sensor array substrate 260a and the display array substrate 260b to a cover lens or cover glass 290c, which may also serve as a platen for the detection of fingerprints. An acoustic impedance matching layer (not shown) may be disposed on an outer surface of the platen 290c. Ultrasonic waves 264 transmitted from one or more sensor elements 262 may travel through the display array substrate 260b and cover glass 290c, reflect from an outer surface of the cover glass 290c, and travel back towards the sensor array substrate 260a where the reflected ultrasonic waves may be detected and image information acquired. In some implementations, the ultrasonic sensor and display array 200c may be used for providing visual information to a user and for touch, stylus or fingerprint detection from the user. Alternatively, a PMUT sensor array may be formed on the backside of the display array substrate 260b. Alternatively, the sensor array substrate 260a with a PMUT sensor array may be attached to the backside of the display array substrate 260b, with the backside of the sensor array substrate 260a attached directly to the backside of the display array substrate 260b, for example, with an adhesive layer or adhesive material (not shown).

In a PMUT array, it is desirable that each PMUT element, while having a single diaphragm, functions as both a transmitter and a receiver of ultrasonic signals in order to improve efficiency, speed and resolution as well as to achieve integration and cost benefits.

Figure 3:
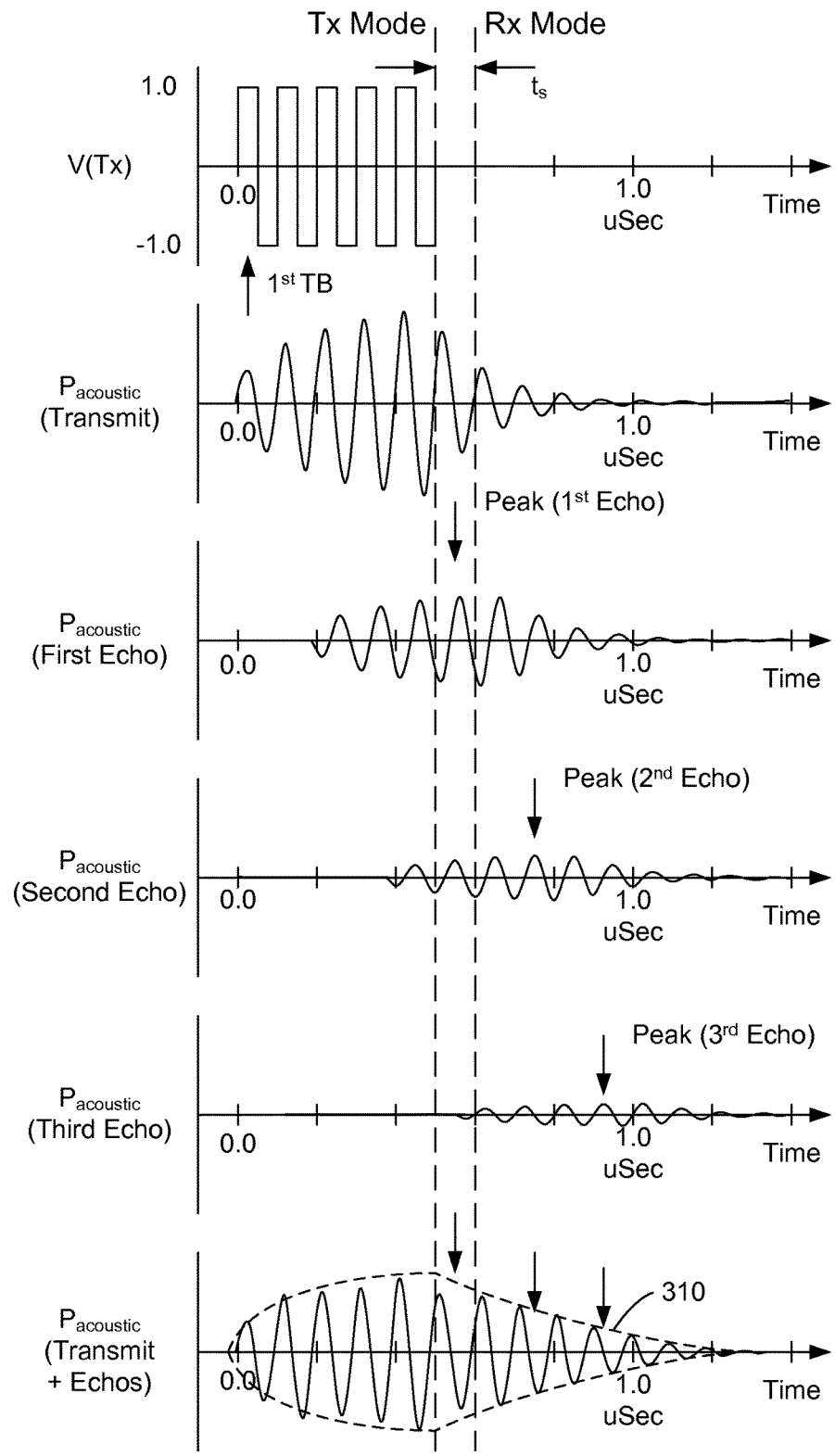
FIG. 3 depicts signal waveforms representative of transmitted and received ultrasonic signals as a function of time.

It is also desirable to minimize stack height of the fingerprint sensors, particularly for mobile devices. As a result, the distance between the PMUT elements and a finger or other object being imaged may be very small. FIG. 3 depicts examples of signal waveforms representative of transmitted and received ultrasonic signals as a function of time for a PMUT array with an approximately 400 micron thick platen positioned on top of the array. FIG. 3 depicts a series of five tone burst (TB) cycles applied to a two-port PMUT (see top graph). The acoustic transmit power depicted in the second graph shows a build-up in acoustic energy in the sensor stack as additional tone burst cycles are applied. When the applied signals are discontinued at the end of the transmit (Tx) mode, the transmitted acoustic power declines. A portion of the transmitted ultrasonic waves may be reflected from the platen surface back towards the PMUT array. The acoustic power at the PMUT array for the first echo is shown in the third graph. Typical ultrasonic transmitter signals may include a series of one or more tone burst (TB) cycles and the echo from the first cycle may arrive back at the receiver prior to completion of the tone burst cycles. Undesirably, outputted and returning ultrasonic signals may substantially overlap. It may be observed that a time interval between an outputted ultrasonic signal and a returning ultrasonic signal (corresponding $1^{st}$ echo) may be very small (less than about 0.2 μsec), depending largely on the acoustic path length through the platen and the speed of sound of material in the acoustic path. As the acoustic waves inside the sensor stack may reverberate within the stack, additional echoes may occur, as depicted in the fourth and fifth graphs. In the sixth (bottom) graph, the acoustic power from all of the reverberations are combined, illustrating the difficulty in detecting the most suitable peak for imaging an object positioned on the surface of the platen. For systems that require switching between the transmit (Tx) mode and a receive (Rx) mode, a small yet finite time $t_s$ may be required to switch between modes, preventing a measurement of the return signal from being made until the receive mode is available. This may make the capture of the peak signal from the first echo difficult. Peak signals from the second echo and subsequent echoes are subsequently diminished in amplitude, decreasing the available signal strength.

Figure 1B:
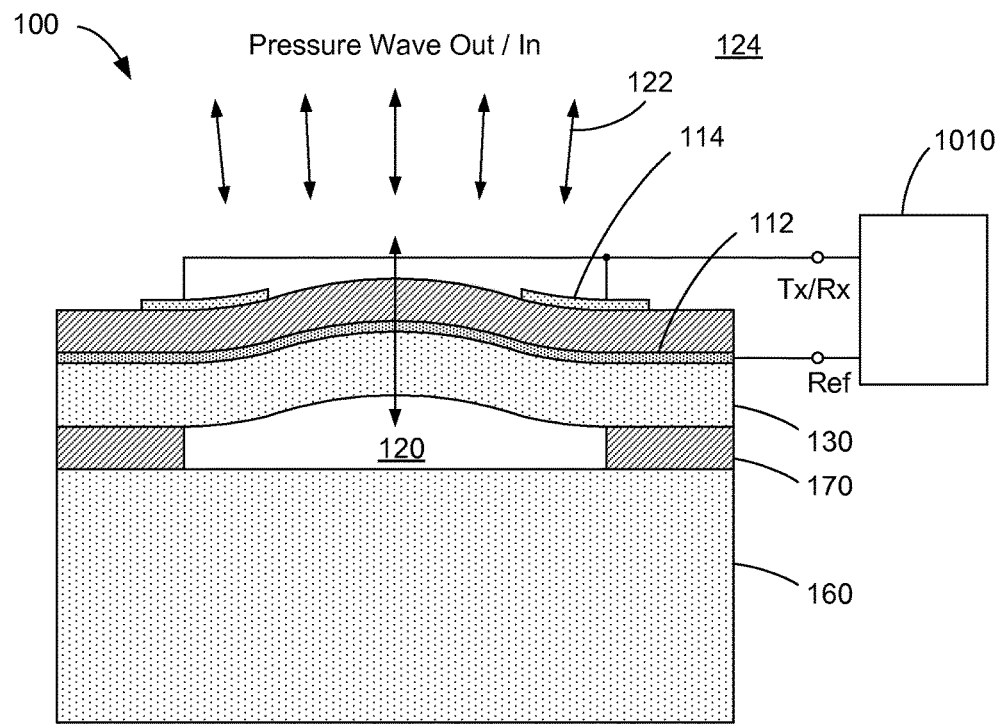

A voltage output from the PMUT to the transceiver circuitry 1010 may be related to the amplitude of the ultrasonic signal at the PMUT. A receive signal envelope 310 shown in the bottom graph of FIG. 3 depicts the buildup of the acoustic signal and the decay after the tone burst cycles have been discontinued. In the absence of the present teachings, due to the substantial overlap between outputted/transmitted and returning/received ultrasonic signals, to detect the return signal, the transceiver circuitry may need to switch from a transmit mode to a receive mode. Because a single pair of electrodes (e.g., lower electrode 112 and upper electrode 114 as shown in FIGS. 1A-B) may be electrically coupled with transceiver circuitry 1010, a separation in time indicated by a switching interval time $t_s$ must be provided between transmitting signals and receiving signals from the electrode pair. The first measurable echo for this arrangement may occur after completion of the switching interval time $t_s$. It will be appreciated that $t_s$ and the time for multiple tone burst cycles at least for a PMUT array sized for a fingerprint sensor can substantially exceed the roundtrip travel time of an ultrasonic signal.

Figure 4A:
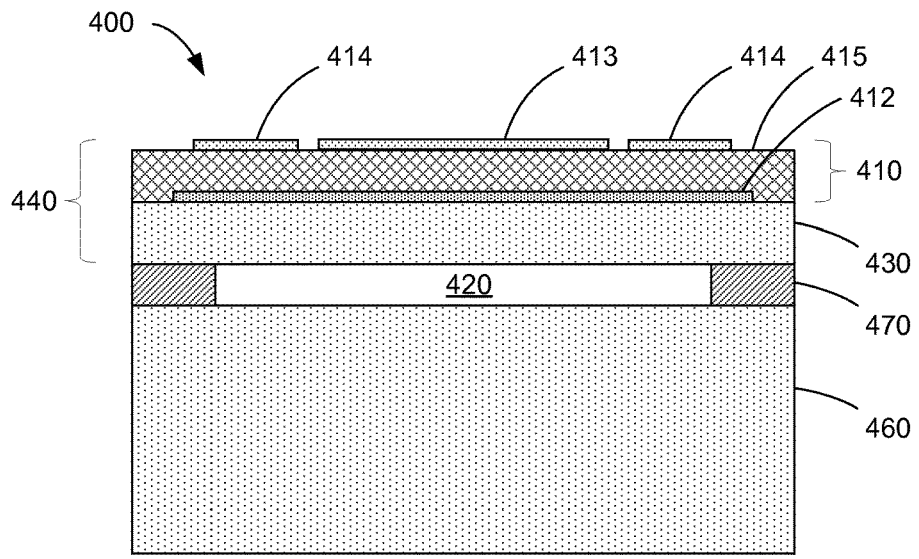
FIGS. 4A and 4B illustrate, respectively, a cross-sectional view and a plan view of a three-port PMUT, according to some implementations.
Figure 4B:
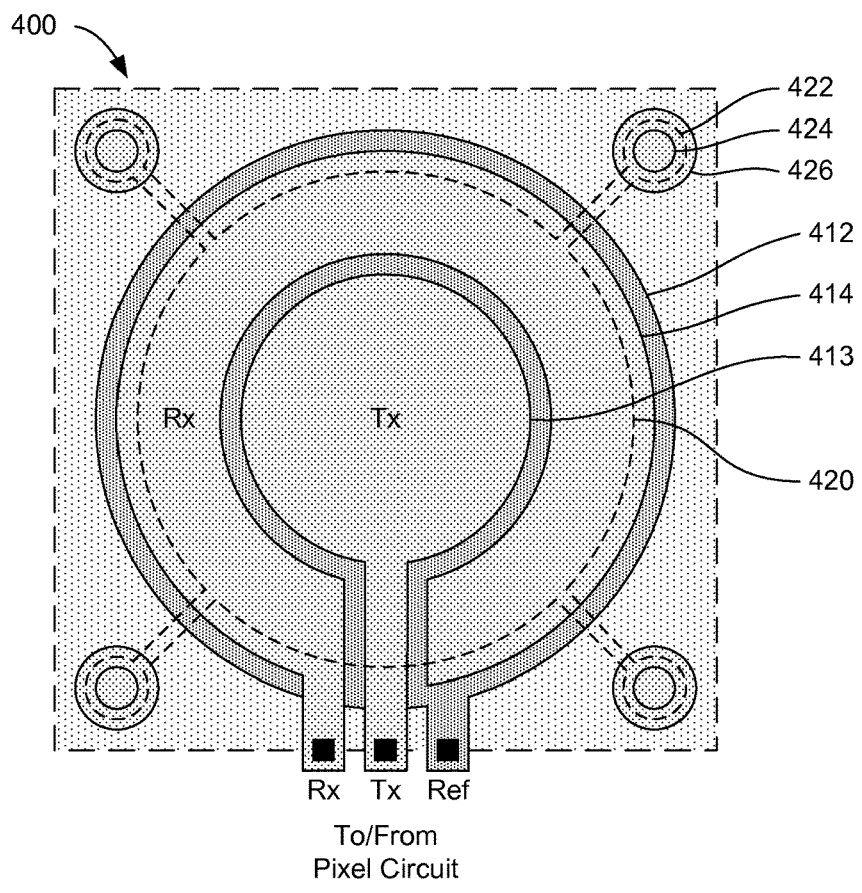

FIGS. 4A and 4B illustrate a cross-sectional view and a plan view of a three-port PMUT, according to some implementations. PMUT 400 includes a piezoelectric layer stack 410 and a mechanical layer 430, configured to form a diaphragm 440, disposed over a cavity 420. The diaphragm 440 is supported by an anchor structure 470 over the cavity 420. The PMUT 400 may be configured to operate with the diaphragm 440 experiencing one or more flexural modes wherein the diaphragm 440 may undergo one or both of flexural motion and vibration when the PMUT transmits or receives ultrasonic signals. The piezoelectric layer stack 410 includes a piezoelectric layer 415 with an associated lower electrode 412 disposed below the piezoelectric layer 415. An inner electrode 413 is disposed above the piezoelectric layer 415 in a central region of the diaphragm 440. In the illustrated implementation, an outer electrode 414 is also disposed above the piezoelectric layer 415. The inner and outer electrodes, disposed on a surface of the piezoelectric layer 415, may be substantially coplanar. The outer electrode 414 may be electrically connected together by extending the outer electrode 414 partially or completely around the perimeter of the three-port PMUT 400 in one example. Alternatively, segmented outer electrodes 414 on the diaphragm 440 may be interconnected internally with one or more jumpers or externally with one or more electrical interconnects in another example (not shown). Contact and via structures may be used to make electrical contact with underlying or external pixel circuitry. The cavity 420 may be connected to one or more etch channels 422 and release holes 424 through which sacrificial material (not shown) may be removed by a suitable etchant to form the cavity 420. One or more plugs 426 of metal or other suitable material may be used to seal the release holes 424 and retain a controlled pressure (e.g. a vacuum level) inside the cavity 420 during PMUT operation. The PMUT shown in FIG. 4B and elsewhere may be part of a PMUT array with one or more rows and columns (not shown), the dashed lines at the periphery of the plan view indicating that additional PMUTs formed on a common substrate may be positioned on one or more sides of the PMUT 400 as part of the PMUT array.

Electrically, a three-port PMUT may be configured as a PMUT with at least one transmit electrode, at least one receive electrode, and at least one reference electrode. Many of these variants are described below. An alternative and sometimes preferred interpretation of a three-port PMUT is a PMUT having an electrical input (Tx) port, an ultrasonic output port (serving also as an ultrasonic input port), and an electrical output (Rx) port. In such implementations, the electrical input port and the electrical output port may, respectively, physically and electrically separated and yet may be disposed on the same portion of the PMUT microstructure (e.g., on the diaphragm above the cavity).

Figure 5:
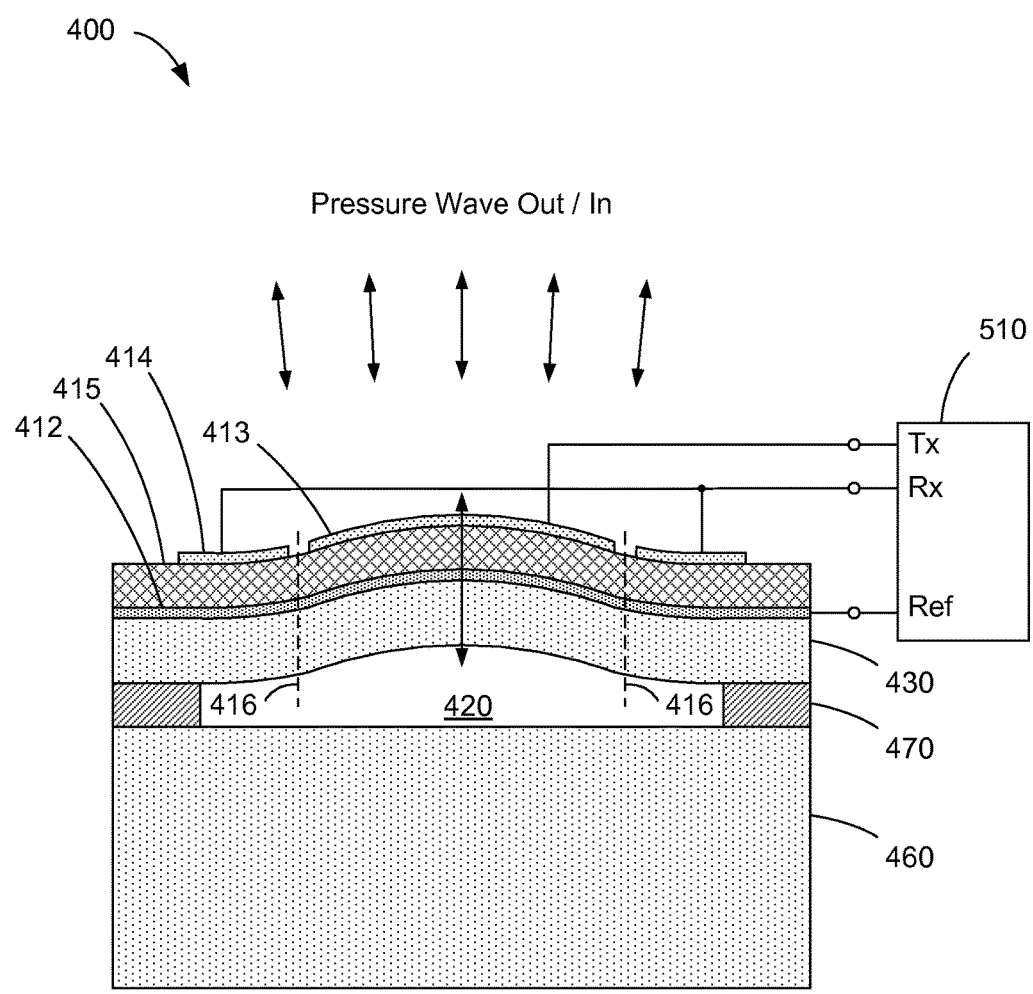
FIG. 5 illustrates an arrangement of a three-port PMUT coupled with transceiver circuitry.

FIG. 5 illustrates an arrangement of a three-port PMUT coupled with transceiver circuitry 510. In the illustrated implementation, the lower electrode 412, inner electrode 413 and outer electrodes 414 may be electrically coupled with transceiver circuitry 510 and may function as separate electrodes providing, respectively, signal transmission, signal reception, and a common reference or ground. This arrangement allows timing of transmit (Tx) and receive (Rx) signals to be independent of each other. More particularly, the illustrated arrangement enables substantially simultaneous transmission and reception of signals between piezoelectric ultrasonic transducer 400 and transceiver circuitry 510.

Advantageously, transmit and receive electrodes may be formed in the same electrode layer during a common fabrication process of deposition, masking and etching, for example. In some implementations, one or more piezoelectric layers and associated electrode layers may be included in the piezoelectric stack (not shown).

Referring still to FIG. 5, transceiver circuitry 510 may be electrically coupled with piezoelectric ultrasonic transducer 400 by way of three input/output terminals or ports associated with the transceiver circuitry 510 and three electrodes 412, 413 and 414 associated with the three-port PMUT. In the illustrated implementation, a first terminal or port is electrically coupled with the lower (reference) electrode 412; a second terminal or port is electrically coupled with the inner (transmit) electrode 413; and a third terminal or port is electrically coupled with the outer (receive) electrode(s) 414.

It should be noted that in the illustrated arrangement, portions of the piezoelectric layer 415 that are proximate to the outer electrodes 414 are in an opposite state of mechanical stress compared to portions of the piezoelectric layer 415 that are proximate to the inner electrode 413 during vibrations of the PMUT diaphragm. More particularly, at the instantaneous moment illustrated in FIG. 5, portions of the piezoelectric layer 415 that are proximate to the outer electrode 414 are in compression, whereas portions of the piezoelectric layer 415 that are proximate to the inner electrode 413 are in tension. Thus, the arrangement may use a difference in the mechanical strain direction on an inside area of the diaphragm compared to an outside area of the diaphragm to improve transmitter and receiver efficiency. For example, where the PMUT cavity 420 is circular, for a portion of the diaphragm 440 disposed over the PMUT cavity 420 (the "suspended portion" of diaphragm 440), an inflection zone exists at about 60-70% of the cavity radius, i.e. the stress direction on the same side (e.g. top or bottom) of the piezoelectric layer stack 410 is of opposite sense on either side of the inflection zone. An approximate location of the inflection zone is indicated by dashed lines 416 in FIG. 5, with inner electrode 413 and outer electrode 414 shown on opposite sides of the inflection zone.

To maximize the transmitter and receiver efficiencies, it is desirable to cover the maximum possible area on the suspended portion having a common sense of stress (e.g. either tensile or compressive). Thus, transmitter and receiver efficiencies may be improved by positioning the outer perimeter of the inner electrode 413 and the inner perimeter of the outer electrode 414 close to the inflection zone. For other shapes such as rectangular or square diaphragms, a similar approach may be applied to optimize the electrode shapes. An outer edge of the outer electrode 414 may be substantially aligned with a perimeter of the cavity 420 or may (as illustrated) extend beyond the walls of the cavity 420.

The PMUT diaphragm may be supported by an anchor structure 470 that allows the diaphragm to extend over the cavity 420. The diaphragm may undergo flexural motion when the PMUT receives or transmits ultrasonic signals. The PMUT diaphragm may operate in a first flexural mode when receiving or transmitting ultrasonic signals. In some implementations, when operating in the first flexural mode, the inner and outer electrodes may experience a respective first and second oscillating load cycle that includes alternating periods of tensile and compressive stress. The first and second oscillating load cycles may be out of phase, that is, one being tensile while the other is compressive on each side of the inflection zone, as shown in FIG. 5. The first and second oscillating load cycles may be approximately 180° out of phase. In other implementations, such as those illustrated in FIGS. 8 (Detail A), 9 (Detail D), 10, 11A-11C, 13A-13D, and 14A-14C below, the first and second oscillating load cycles may be approximately in phase.

Figure 6:
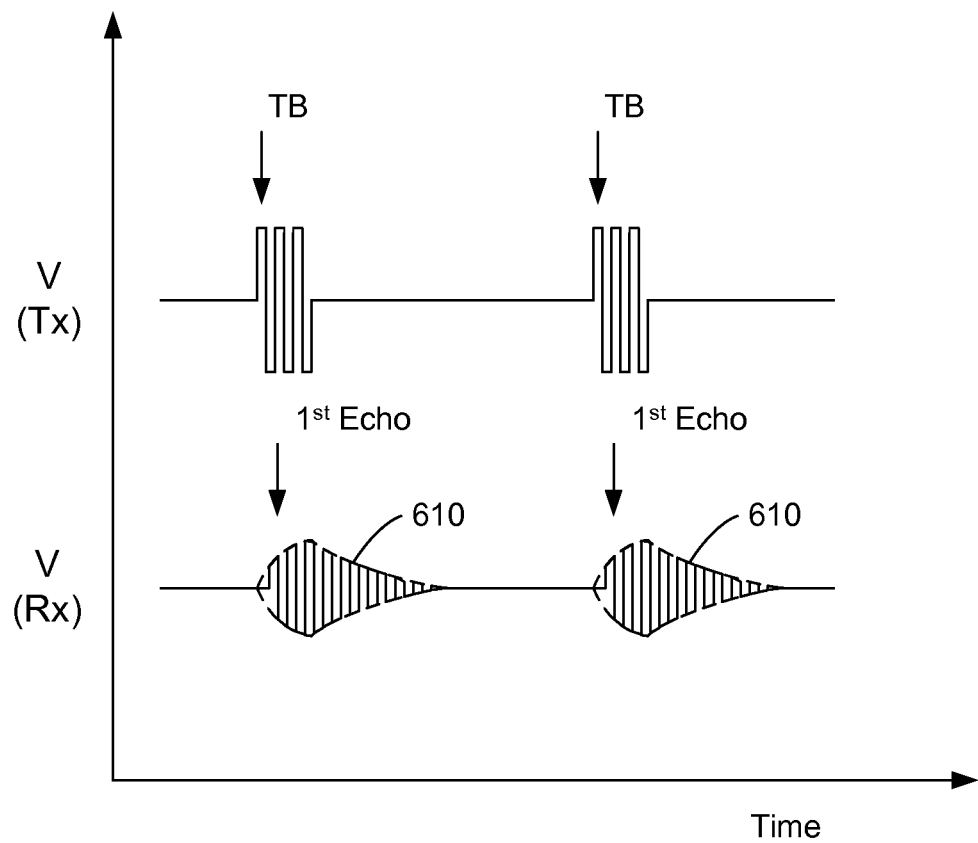
FIG. 6 illustrates a plot of transmit and receive voltage signals as a function of time for a three-port PMUT, according to some implementations.

Because the presently disclosed techniques provide for physical and electrical separation between the Tx and Rx electrodes, the receive electrode may be operable to receive ultrasonic signals while the transmit electrode is emitting ultrasonic signals. FIG. 6 illustrates a plot of transmit and receive voltage signals as a function of time for a three-port PMUT, according to some implementations. Benefits of the presently disclosed techniques may be better appreciated by comparing FIG. 6 and FIG. 3. Unlike the time-separated transmit and receive modes illustrated in FIG. 3, the present invention allows substantially simultaneous reception and transmission of voltage signals. As a result, a large echo (e.g., $1^{st}$ echo) may be detected irrespective of how closely in time the first echo follows the first tone burst (TB) signal. In some implementations, the reflections of ultrasonic waves from an object being imaged such as a finger may significantly overlap with the tone burst signal, allowing a build-up of acoustic energy that varies with the presence of a fingerprint ridge or a fingerprint valley on a surface of a PMUT sensor array, as shown by the receive signal envelope 610. Capturing the Rx signals and determining the differences in signal amplitudes between ridges and valleys with the PMUT sensor array allows image information for an ultrasonic image of a fingerprint to be acquired. Multiple sets of image information may be acquired by firing the transmit electrode and receiving the return signals with the PMUT sensor array multiple times, as indicated in FIG. 6.

A further advantage of the presently disclosed techniques is that, compared to a two-port PMUT, the three-port PMUT transceiver may have a single lower electrode positioned below the transmit and receive electrodes that is connected to a reference voltage such as a ground potential. Grounding the lower electrode or otherwise connecting the lower electrode to a low impedance voltage source may reduce electrical crosstalk between transmit and receive portions of the transceiver circuitry and/or reduce crosstalk between adjacent PMUT sensor elements. For two-port PMUT designs, where the same port is used for both transmit and receive functions, a parasitic capacitance from the transmitter electronics may reduce the received signal strength by a factor of ten or more. The presently disclosed three-port PMUT inherently separates the transmitter from the receiver, thereby reducing the need for signal isolation and minimizing losses due to associated parasitic capacitance. This is possible because three-port PMUT configurations allow the use of a low parasitic capacitance pixel readout scheme for the receive electrode while the transmitter is connected to a higher voltage circuit that typically has high parasitic losses. Thus, the receiver efficiency may be substantially improved with three-port configurations.

Moreover, because the ports in a two-port PMUT may not be directly connected to ground but rather may be connected to ground through switches, electrical cross-talk may affect the performance. The presently disclosed three-port PMUT may avoid this problem in part because the lower electrode may be well grounded. As a result, any cross-talk signal may be absorbed to ground instead of affecting an adjacent pixel while either transmitting or receiving.

Referring again to FIG. 5, in the illustrated implementation, a mechanical layer 530 is disposed between the cavity 420 and the piezoelectric layer 415. Such an arrangement may be referred to as a "bottom mech" arrangement.

Figure 7:
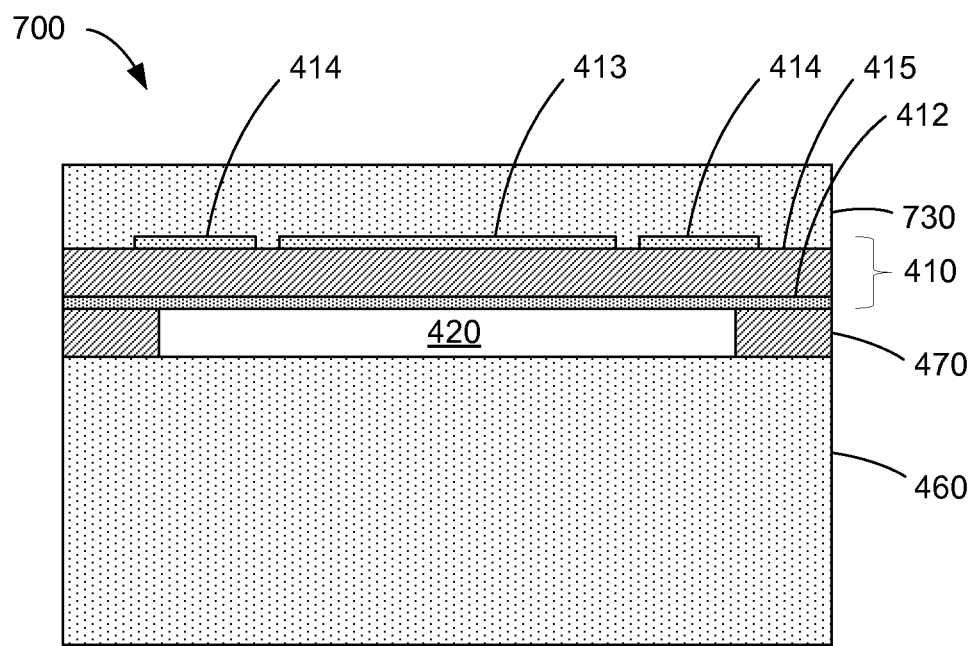
FIG. 7 illustrates another arrangement of a three-port PMUT, according to some implementations.

FIG. 7 illustrates another arrangement of a three-port PMUT according to some implementations. In the illustrated implementation, the three-port PMUT 700 is configured in a "top mech" arrangement where the piezoelectric layer 415 is disposed between the cavity 420 and a mechanical layer 730.

Figure 8:
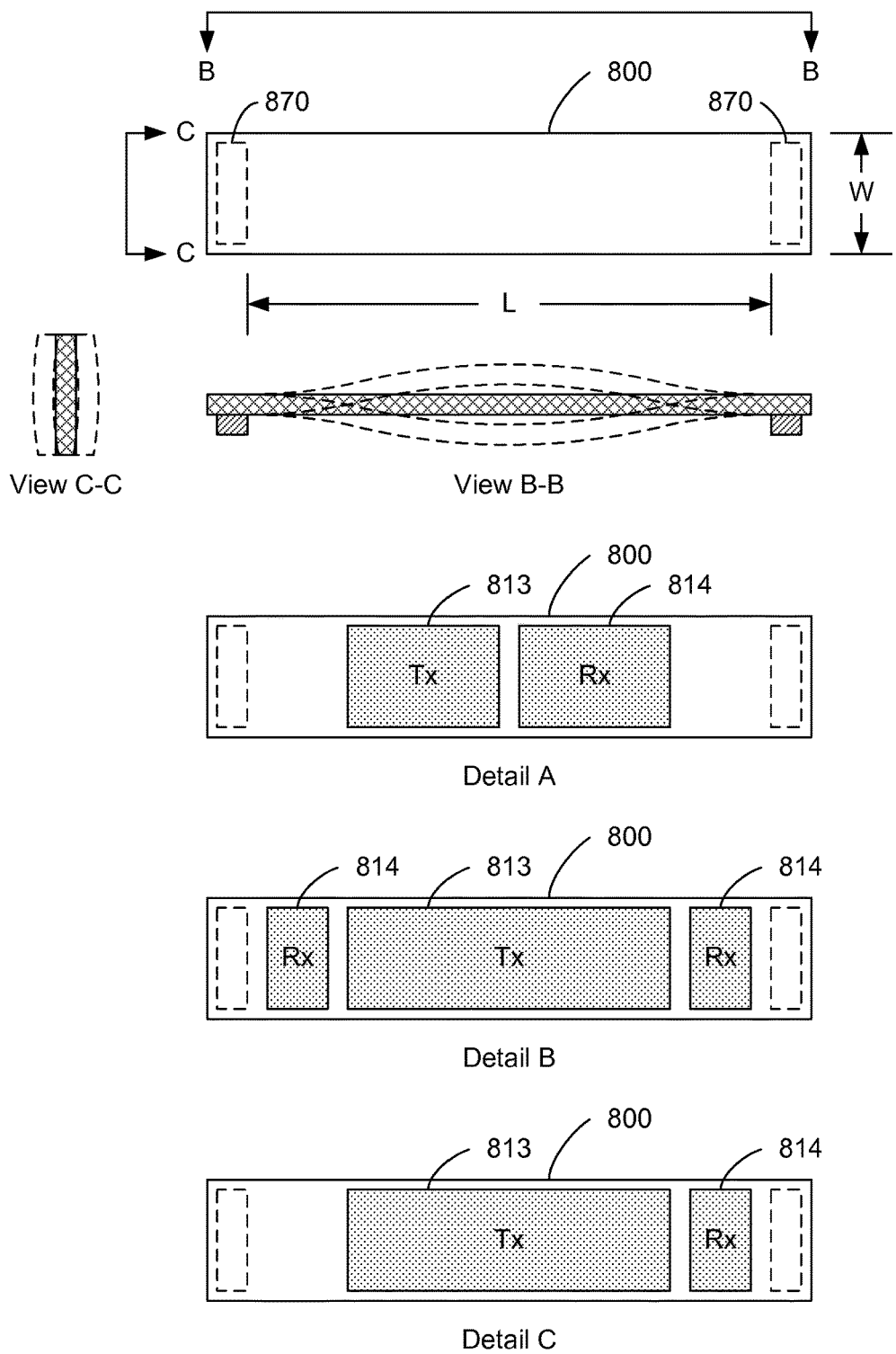
FIG. 8 illustrates example configurations of a long rectangular diaphragm for a three-port PMUT, according to some implementations.

The presently disclosed techniques may be implemented with substantially circular diaphragms as described hereinabove. A number of alternative configurations are also contemplated. FIG. 8 illustrates example configurations of a long rectangular diaphragm for a three-port PMUT according to some implementations. In the illustrated implementation (which may be referred to as a long rectangular plate or "ribbon configuration"), a long dimension L of the diaphragm 800 is at least two times longer than the width dimension W. A "long" rectangular plate or diaphragm may be defined as a diaphragm with a length at least twice the width. With long rectangular diaphragms, the shapes of the electrodes may also become rectangular with longer sides, with less concern about the placement and shape of the electrodes along the shorter sides of the diaphragm. The diaphragm 800 may be supported by separate anchor structures 870, disposed for example as shown proximate to opposite ends of the long dimension L. As a result, flexural motion of the diaphragm 800, as illustrated in View B-B and View C-C, may occur during transmission and reception of ultrasonic waves or signals. Transmit electrodes 813 (Tx) and receive electrodes 814 (Rx) may be disposed on the diaphragm 800 in various arrangements, a few of which are illustrated by way of example in Detail A, Detail B, and Detail C. More particularly, as may be observed in Detail A, in some implementations the transmit electrode 813 and the receive electrode 814 may be approximately equal in size and may be disposed symmetrically with respect to the diaphragm 800. As may be observed in Detail B, in other implementations the transmit electrode 813 and the receive electrode 814 may be of substantially different size and may be disposed symmetrically with respect to the diaphragm 800. Finally, as may be observed in Detail C, an asymmetric arrangement of the transmit electrode 813 and the receive electrode 814 may be contemplated. While the configurations shown in Detail A, B and C have electrodes specifically labeled as Tx or Rx, the electrodes marked Tx may serve as receive electrodes and the electrodes marked Rx may serve as transmit electrodes without loss of generality in FIG. 8 and throughout this disclosure. The diaphragm geometries shown may also be square or have L:W ratios of less than 2:1 without loss of generality. Electrical connections (e.g. electrical traces) to the transmit electrodes and receive electrodes and electrical contacts thereto are not shown in the accompanying diagrams for clarity.

Figure 9:
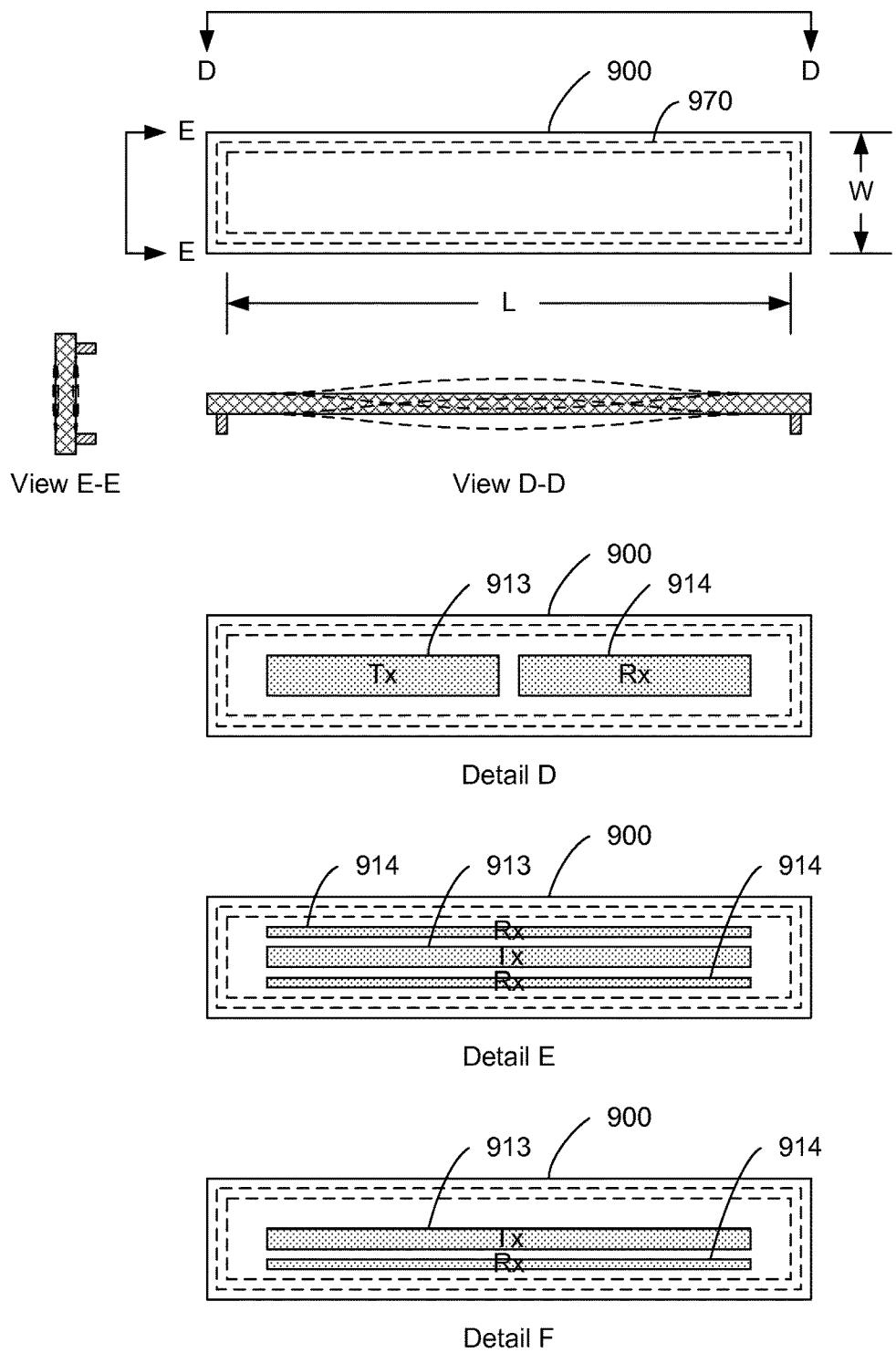
FIG. 9 illustrates further example configurations of a long rectangular diaphragm for a three-port PMUT, according to some implementations.

FIG. 9 illustrates further example configurations of a rectangular diaphragm for a three-port PMUT according to some implementations. In the illustrated long rectangular plate configurations, the diaphragm 900 may be supported on all four sides by a perimeter anchor structure 970, disposed for example as shown proximate to the peripheral edges of the diaphragm 900. As a result, flexural motion of the diaphragm 900, as illustrated in View D-D and View E-E, may occur during transmission and reception of ultrasonic waves or signals. Transmit electrodes 913 (Tx) and receive electrodes 914 (Rx) may be disposed on the diaphragm 900 in various arrangements, a few of which are illustrated by way of example in Detail D, Detail E, and Detail F. More particularly, as may be observed in Detail D, in some implementations the transmit electrode 913 and the receive electrode 914 may be approximately equal in size and may be disposed symmetrically with respect to the diaphragm 900. As may be observed in Detail E, in other implementations the transmit electrode 913 and the receive electrode 914 may be of substantially different size and may be disposed symmetrically with respect to the diaphragm 900. Finally, as may be observed in Detail F, an asymmetric arrangement of the transmit electrode 913 and the receive electrode 914 may be contemplated.

Figure 10:
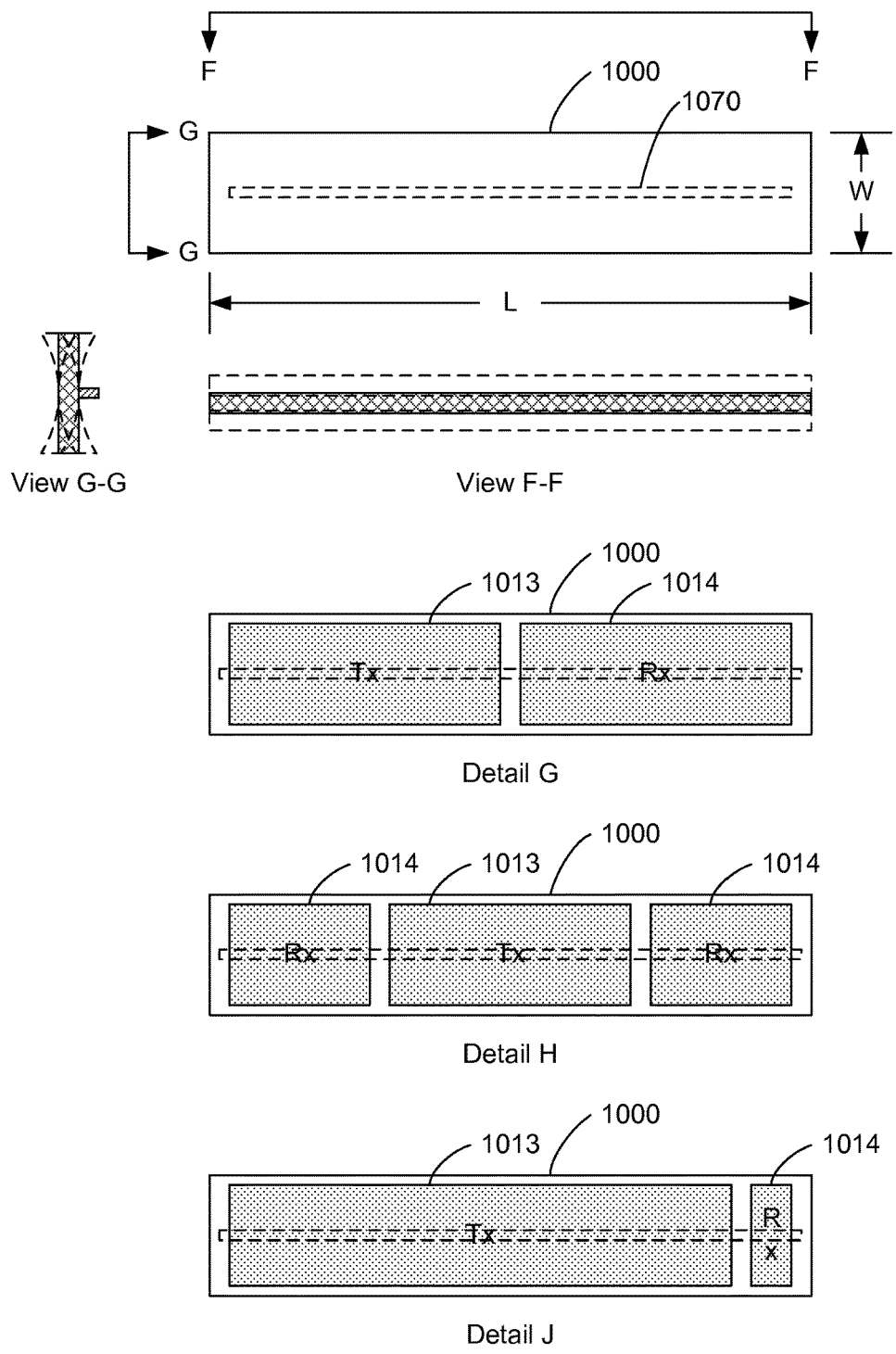
FIG. 10 illustrates yet further example configurations of a long rectangular diaphragm for a three-port PMUT, according to some implementations.

FIG. 10 illustrates yet further example configurations of a rectangular diaphragm for a three-port PMUT according to some implementations. In the illustrated implementation (which may be referred to as a "mushroom configuration"), the diaphragm 1000 may be supported by a centrally disposed anchor structure 1070. As a result, flexural motion of the diaphragm 1000 as illustrated in View F-F and View G-G may occur during transmission and reception of ultrasonic waves. Transmit electrodes 1013 (Tx) and receive electrodes 1014 (Rx) may be disposed on the diaphragm 1000 in various arrangements, a few of which are illustrated by way of example in Detail G, Detail H and Detail J. More particularly, as may be observed in Detail G, in some implementations the transmit electrode 1013 and the receive electrode 1014 may be approximately equal in size and may be disposed symmetrically with respect to the diaphragm 1000. As may be observed in Detail H, in other implementations the transmit electrode 1013 and the receive electrode 1014 may be of substantially different size and may be disposed symmetrically with respect to the diaphragm 1000. Finally, as may be observed in Detail J, an asymmetric arrangement of the transmit electrode 1013 and the receive electrode 1014 may be contemplated.

Figure 11A:
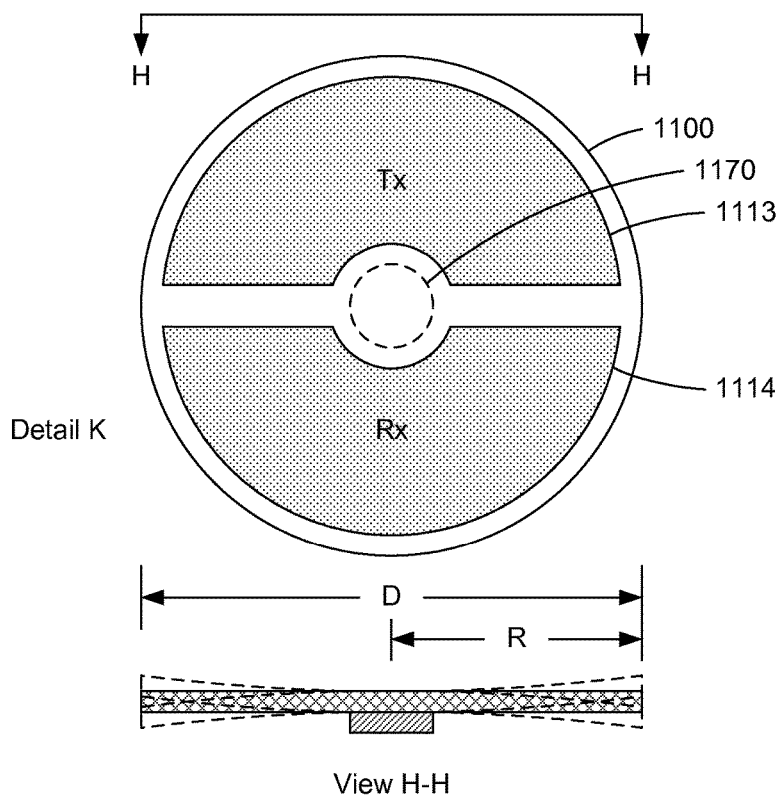
FIGS. 11A-11C illustrate example configurations of a circular diaphragm for a three-port PMUT, according to various implementations.
Figures 11B, 11C:
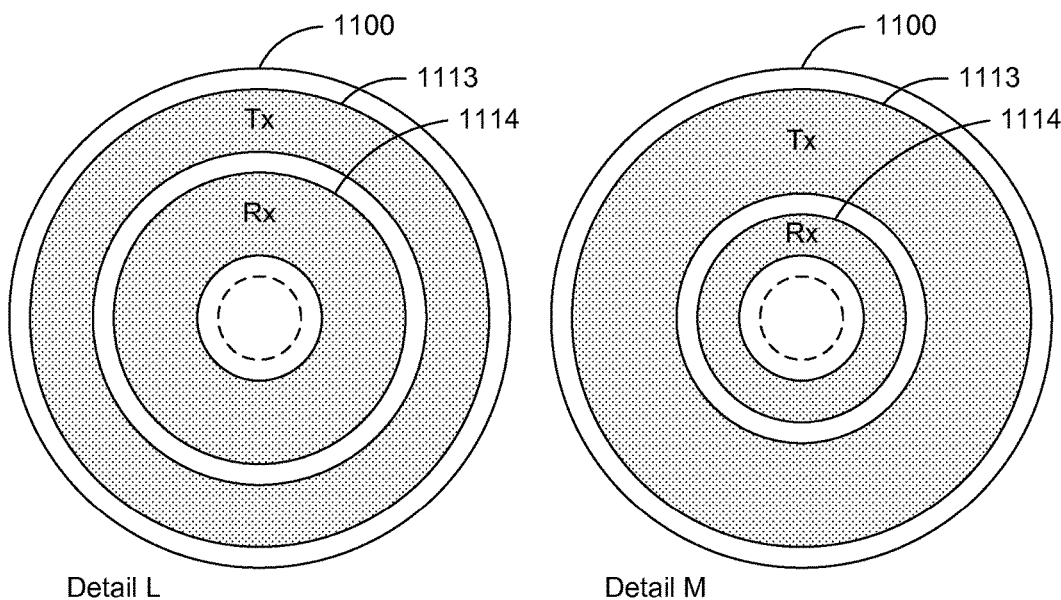

FIG. 11 illustrates further example configurations of a circular diaphragm for a three-port PMUT according to various implementations. In each of the examples of mushroom configurations illustrated in Detail K, Detail L, and Detail M, a circular diaphragm 1100 is supported by a centrally disposed anchor structure 1170. As a result, flexural motion of the diaphragm 1100 as illustrated in View H-H may occur during transmission and reception of ultrasonic waves. Transmit electrodes 1113 (Tx) and receive electrodes 1114 (Rx) may be disposed on the diaphragm 1100 in various arrangements. More particularly, as may be observed in Detail K and Detail L, in some implementations the transmit electrode 1113 and the receive electrode 1114 may be approximately equal in size. As may be observed in Detail M, in other implementations the transmit electrode 1113 and the receive electrode 1114 may be of substantially different size.

Figure 12:
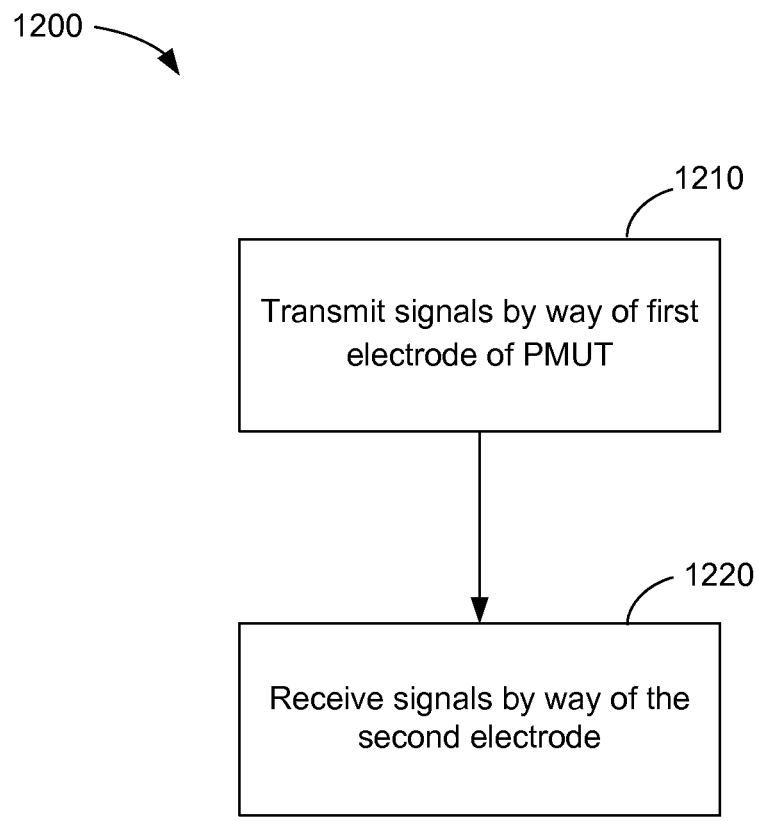
FIG. 12 illustrates an example of a method for operating a PMUT sensor, according to some implementations.

FIG. 12 illustrates an example of a method for operating a PMUT sensor, according to some implementations. As described hereinabove, the PMUT sensor may include a diaphragm disposed over a cavity, the diaphragm including a piezoelectric layer stack including a piezoelectric layer, a first electrode, a second electrode and a reference electrode, each of the first electrode, the second electrode and the reference electrode being electrically coupled with transceiver circuitry. In the illustrated implementation, method 1200 includes a step 1210 for transmitting, during a first time period, responsive to signals from the transceiver circuitry first ultrasonic signals by way of the first electrode.

The method may proceed, at step 1220, with receiving during a second time period second ultrasonic signals by way of the second electrode. Advantageously, the first time period and the second time period are at least partially overlapping. In some implementations, the PMUT may be configured to simultaneously transmit first ultrasonic signals by way of the first electrode and to receive second ultrasonic signals by way of the second electrode.

Figure 13A:
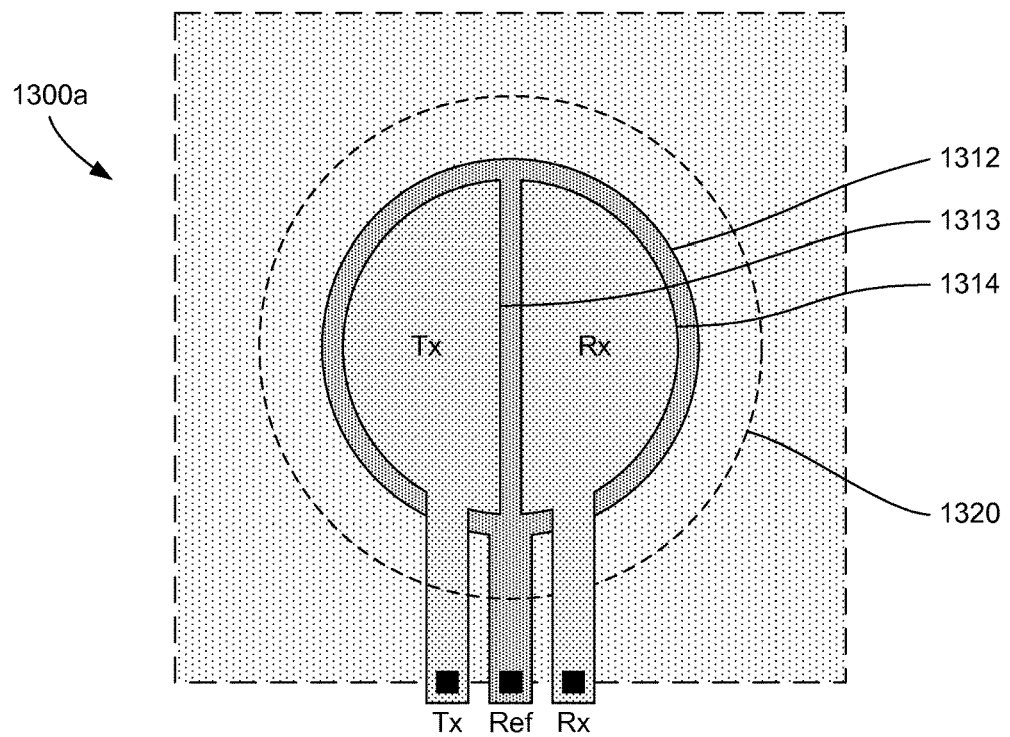
FIGS. 13A-13D illustrate plan views of a three-port PMUT with a circular diaphragm and various electrode configurations, according to some implementations.
Figure 13B:
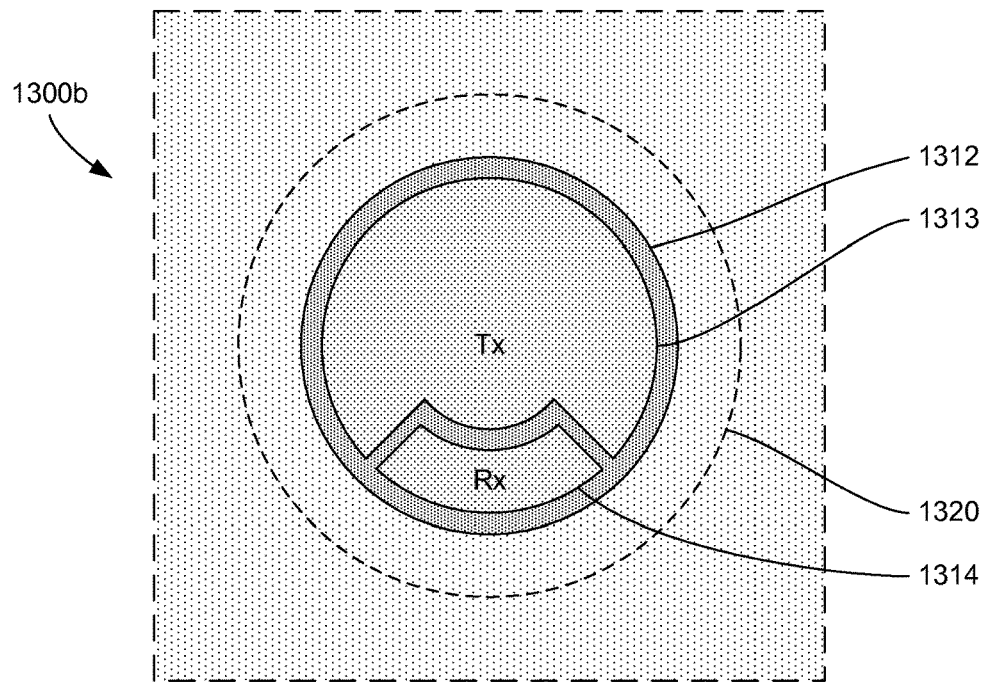

FIGS. 13A-13D illustrate plan views of a three-port PMUT with a circular diaphragm and various electrode configurations, according to some implementations. Three-port PMUT 1300a in FIG. 13A has a transmit electrode 1313 (Tx) and a receive electrode 1314 (Rx) positioned in an inner region of the PMUT diaphragm. The transmit electrode 1313 and the receive electrode 1314 are both located inside the inflection zone, so both experience the same sign of bending stress (tensile or compressive) when the diaphragm vibrates, either to launch ultrasonic waves or to receive ultrasonic waves. A lower reference electrode 1312 is shown along with the upper transmit electrode 1313 and receive electrode 1314 with connective electrical traces and contacts for connections to transceiver circuitry. The PMUT diaphragm extends over the cavity 1320. Three-port PMUT 1300a shows symmetrical transmit and receive electrodes in an inner region of the PMUT diaphragm (inside the inflection zone), whereas three-port PMUT 1300b in FIG. 13B shows asymmetrical transmit and receive electrodes inside the inflection zone with a larger transmit electrode and a smaller receive electrode. Smaller receive electrodes may be useful to allow more area for larger transmit electrodes (e.g., more acoustic transmit power for the same size diaphragm and actuation voltage), while still retaining adequate receive signal levels on the receive side.

Figure 13C:
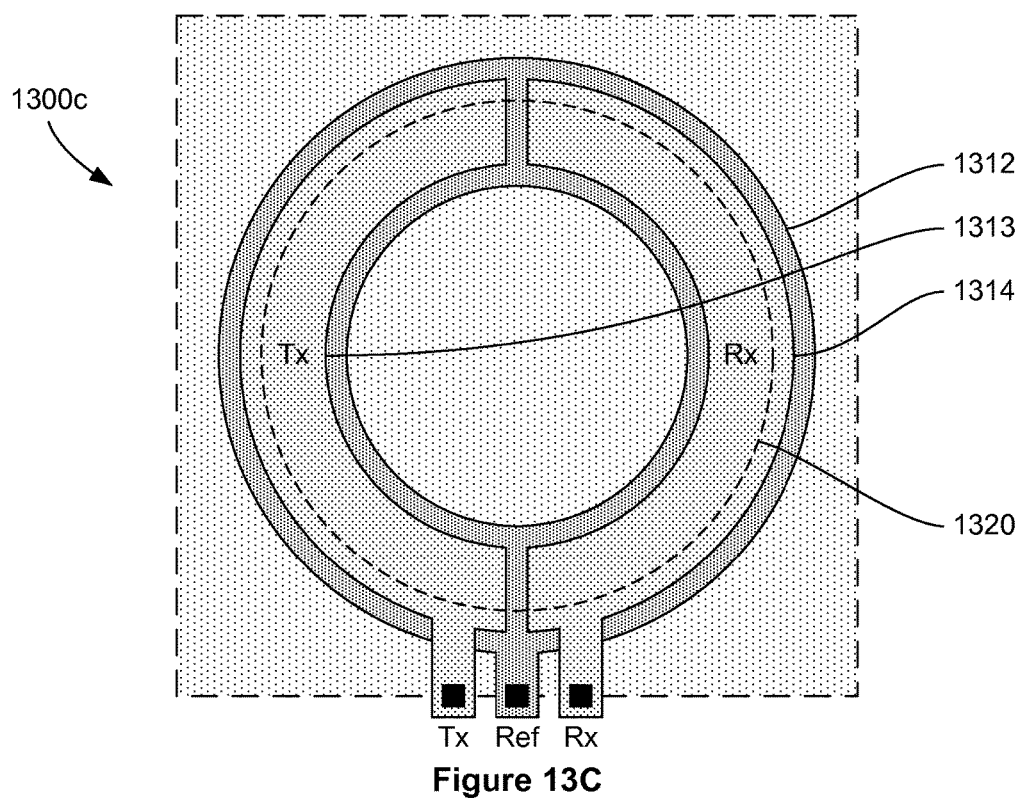
Figure 13D:
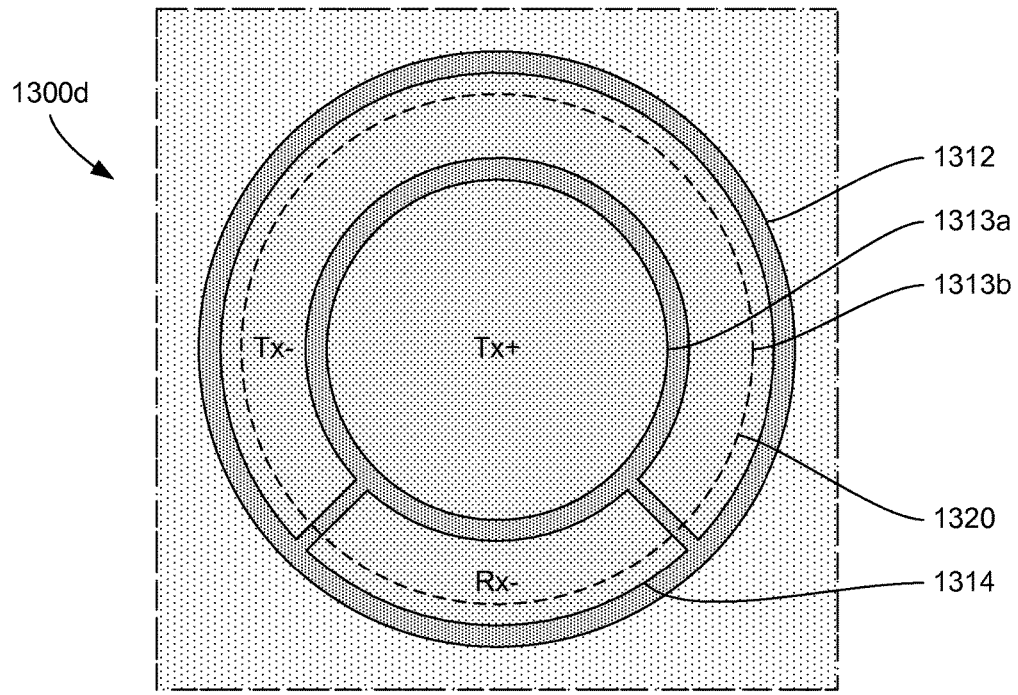
Figure 14A:
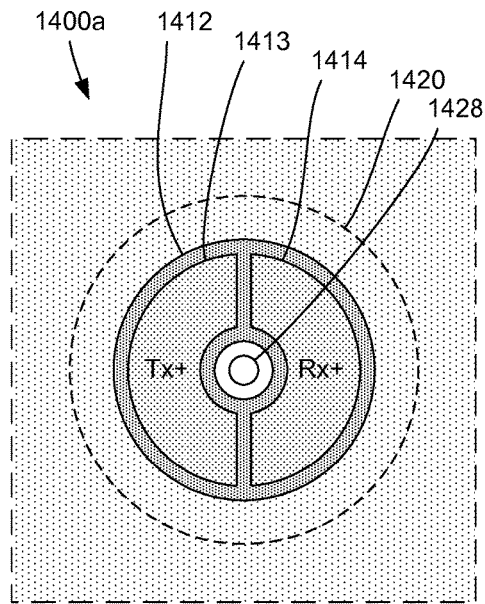
FIGS. 14A-14D illustrate plan views of a three-port PMUT with a circular diaphragm having various electrode configurations and a center release hole, according to some implementations.
Figure 14B:
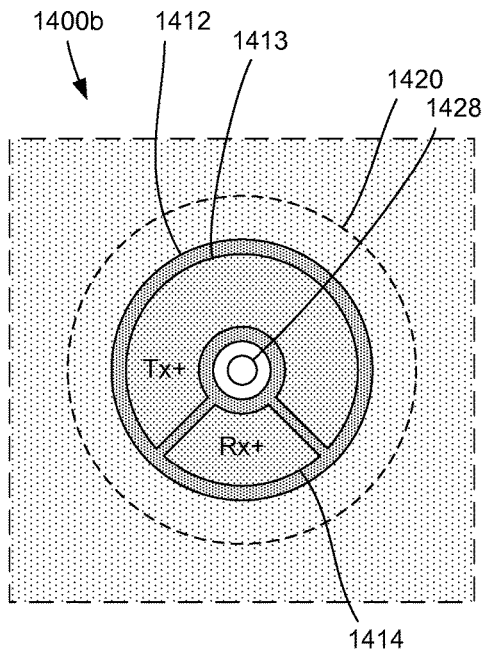
Figure 14C:
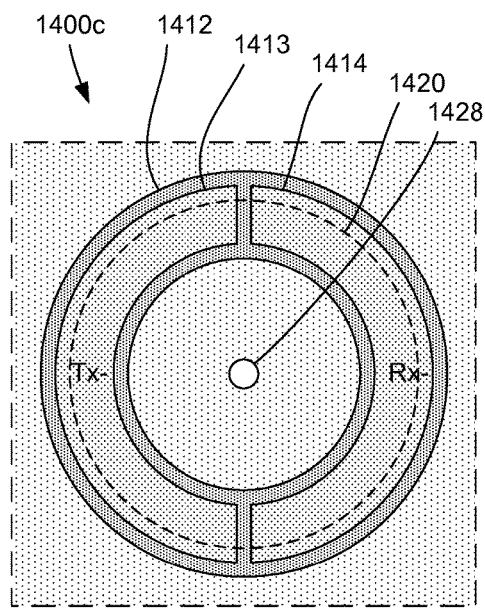
Figure 14D:
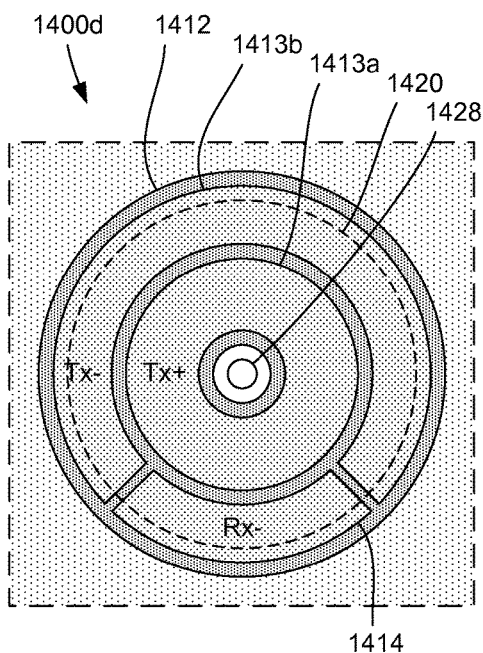

Three-port PMUT 1300c in FIG. 13C has a symmetric transmit electrode 1313 (Tx) and receive electrode 1314 (Rx) positioned in an outer region of the PMUT diaphragm, where both transmit and receive electrodes are positioned outside the inflection zone and therefore experience the same sign of bending stress (compressive or tensile) when the diaphragm vibrates. Asymmetrical transmit and receive electrode arrangements in the outer portion of the PMUT diaphragm have been contemplated. Three-port PMUT 1300d in FIG. 13D shows an asymmetrical arrangement of a transmit electrode 1313b (Tx−) and receive electrode 1314 (Rx−) in the outer region of the diaphragm, and an additional transmit electrode 1313a (Tx+) positioned in the inner region of the diaphragm. Dual transmit electrodes, with one in an inner region and one in an outer region of the PMUT diaphragm, allow for the generation of more acoustic power when driven differentially, as described in more detail below. In general, symmetrical or asymmetrical arrangements of transmit and receive electrodes may be applied to transmit and/or receive electrodes that are inside or outside the inflection zone.

FIGS. 14A-14D illustrate plan views of a three-port PMUT with a circular diaphragm having various electrode configurations and a center release hole 1428 disposed through the diaphragm, according to some implementations. Center release holes 1428 may be formed through the PMUT diaphragm to allow removal of sacrificial material (not shown) to form cavity 1420 and to suspend the PMUT diaphragm over the cavity region. Three-port PMUT 1400a has a symmetric transmit electrode 1413 (Tx+) and receive electrode 1414 (Rx+) along with a reference electrode 1412, with both the transmit electrode and receive electrode positioned in an inner portion of the diaphragm inside the inflection zone. Three-port PMUT 1400b has an asymmetric transmit electrode 1413 (Tx+) and receive electrode 1414 (Rx+) located on the same side of the inflection zone. Three-port PMUT 1400c shows a symmetric transmit electrode 1413 (Tx−) and receive electrode 1414 (Rx−) positioned in an outer region of the PMUT diaphragm, outside of the inflection zone. Three-port PMUT 1400d shows an arrangement with push-pull transmit electrodes 1413a (Tx+) and 1413b (Tx−) and a single receive electrode 1414 (Rx−). Transmit electrode 1413a is inside the inflection zone, while transmit electrode 1413b and receive electrode 1414 are outside the inflection zone. Three-port PMUTs with symmetrical or asymmetrical arrangements of transmit and receive electrodes may be applied to one or more transmit and/or receive electrodes that are inside or outside the inflection zone, with or without center release holes, with circular, square, rectangular or long rectangular diaphragms.

Figure 15:
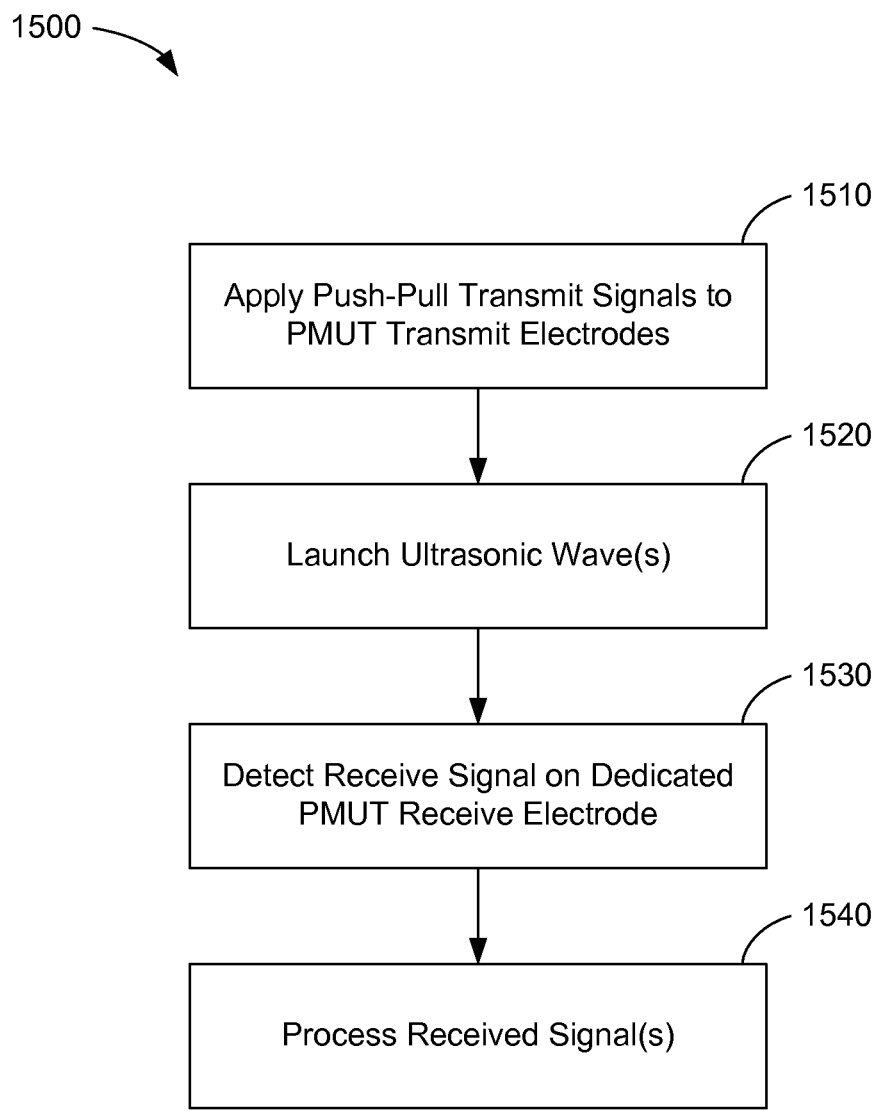
FIG. 15 illustrates a block diagram of a method for operating a PMUT sensor having at least one dedicated receive electrode, according to some implementations.

FIG. 15 illustrates a block diagram of a method 1500 for operating a PMUT sensor having at least one dedicated receive electrode, according to some implementations. Differential push-pull transmit voltage signals may be applied to PMUT transmit electrodes that are positioned on opposite sides of the inflection zone, as shown in block 1510. Vibrations of the PMUT diaphragm may launch one or more ultrasonic waves, as shown in block 1520. Reflected ultrasonic waves from a distant or near object may be detected by one or more dedicated PMUT receive electrodes, as shown in block 1530. The received signals may be processed, for example, to generate an ultrasonic image, detect a gesture, determine the position of a stylus tip, or to validate a user when used as a biometric sensor such as an ultrasonic fingerprint sensor, as shown in block 1540.

Figure 16:
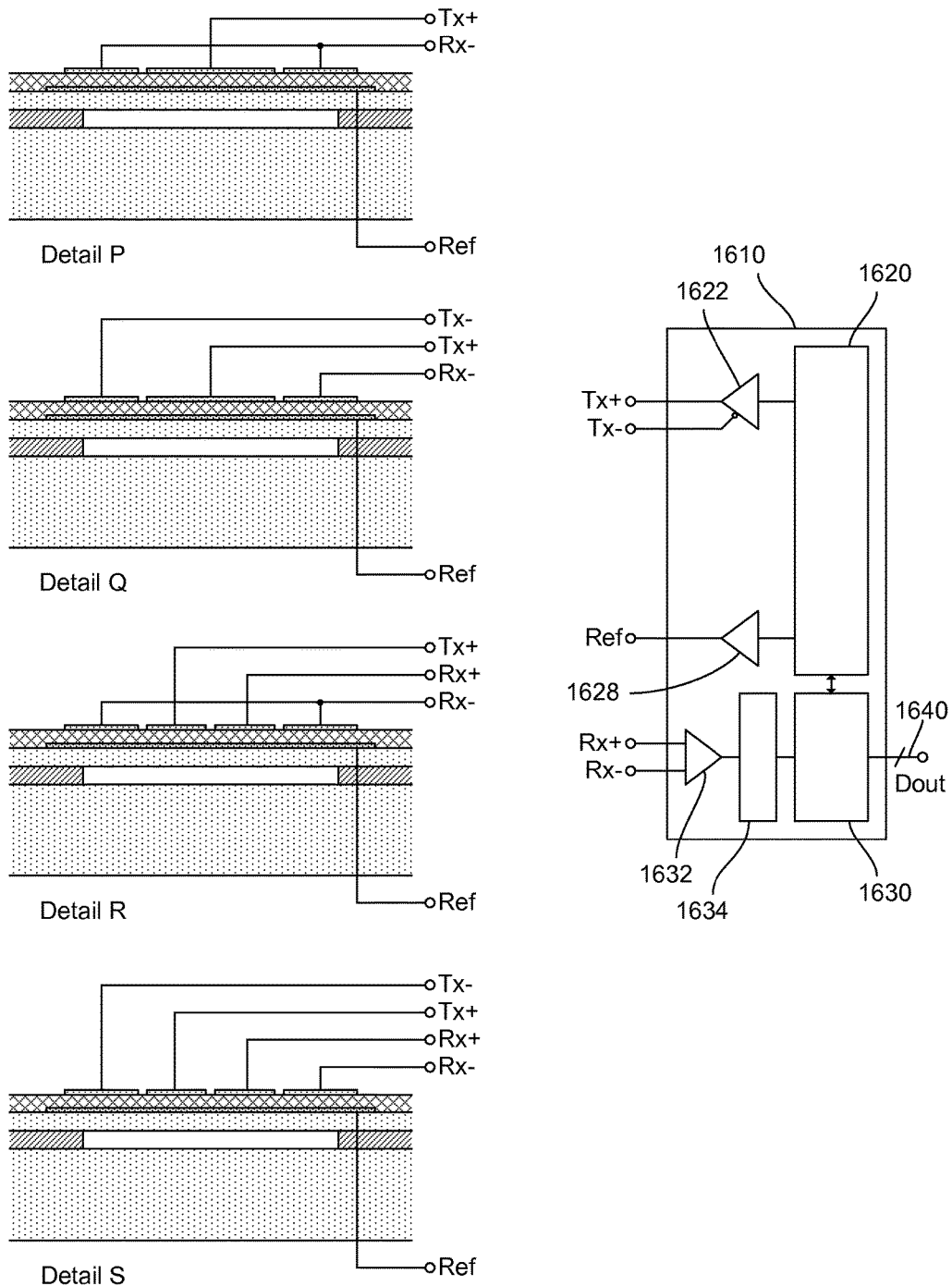
FIG. 16 illustrates a schematic diagram of transceiver circuitry and various configurations of a three-port PMUT with at least one dedicated receive electrode, according to some implementations.

FIG. 16 illustrates a schematic diagram of transceiver circuitry 1610 and various configurations of a three-port PMUT with at least one dedicated receive electrode, according to some implementations. Transceiver circuitry 1610 may include a control unit 1620 for generating ultrasonic waves and for receiving ultrasonic signals. Signals from the control unit 1620 may be amplified, buffered, or otherwise conditioned with a transmitter drive circuit 1622 to provide push-pull transmit signals that may be applied to the positive transmit electrode (Tx+) and negative transmit electrode (Tx−) of a three-port PMUT as applicable. A reference electrode of a PMUT may be connected to a reference voltage level (such as ground) via a reference level drive circuit 1628 that may receive reference level signals from the control unit 1620. Receive signals from one or more receive electrodes on the PMUT may be amplified, buffered or otherwise conditioned with a receiver circuit 1632 and converted to a digital signal via an analog-to-digital (A/D) converter 1634 before being processed by a signal processing unit 1630. The processed signals may be provided on one or more digital output lines 1640 for further processing, such as with an applications processor of a mobile device. Detail P shows a cross-sectional view of a three-port PMUT with a center transmit electrode (Tx+) and an outer receive electrode (Rx−) along with a reference electrode (Ref) that may be connected to transceiver circuitry 1610. Detail Q shows a three-port PMUT with push-pull transmit electrodes (Tx+ and Tx−) and a single, dedicated receive electrode (Rx−). Detail R shows a cross-sectional view of a three-port PMUT with a single transmit electrode (Tx+) and a pair of differential receive electrodes (Rx+ and Rx−). The differential receive electrodes may be positioned on opposite sides of the inflection zone to increase the level of the output signals obtainable and to cancel some common-mode effects such as temperature variations or noise signals common to both receive electrodes. Detail S shows a cross-sectional view of a three-port PMUT with a differential pair of transmit electrodes (Tx+ and Tx−) and a differential pair of receive electrodes (Rx+ and Rx−).

Figure 17:
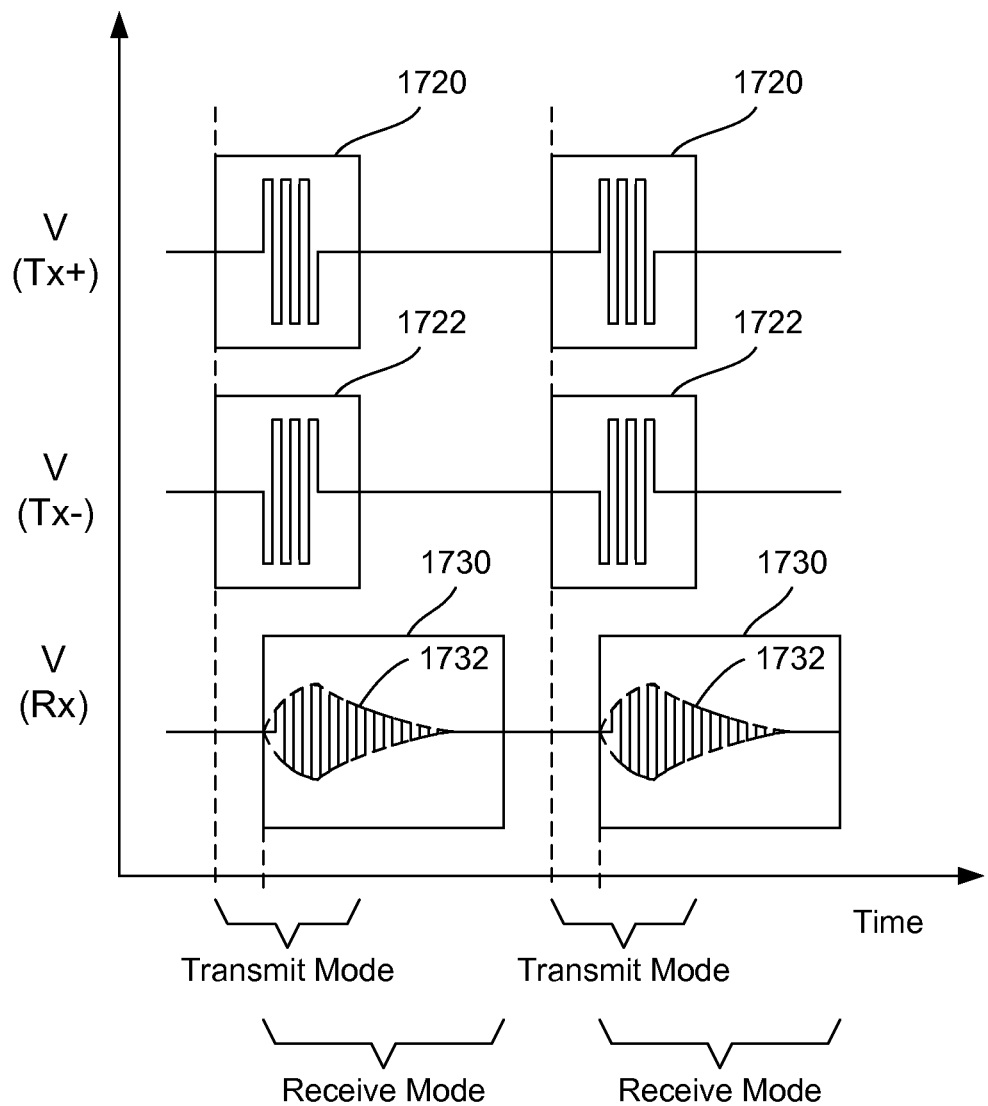
FIG. 17 illustrates a plot of push-pull transmit signals and illustrative receive signals as a function of time for a three-port PMUT with at least one dedicated receive electrode, according to some implementations.

FIG. 17 illustrates a plot of push-pull transmit signals 1720, 1722 and illustrative receive signals 1730 as a function of time for a three-port PMUT with at least one dedicated receive electrode, according to some implementations. When operating in a transmit mode, a pair of differential transmit signals 1720 and 1722 may be applied to a differential pair of transmit electrodes on a suitably configured three-port PMUT. Reflected signals may occur shortly after launch of the ultrasonic waves, and an illustrative receive signal 1730 within a receive signal envelope 1732 may be detected during a receive mode and processed. In some implementations, a peak detector (not shown) may be used to acquire ultrasonic signals at a predetermined acquisition time delay (e.g., range-gate delay or RGD) after the ultrasonic waves are launched. The peak detector may acquire signals over a relatively short period of time (e.g., less than a period of an ultrasonic wave) by using a relatively narrow acquisition time window (e.g., range-gate window or RGW). This process may be repeated for each PMUT as desired. For example, a fingerprint image may be acquired by launching one or more plane waves from an array of PMUTs operating in a transmit mode, then capturing reflected ultrasonic signals with the array of PMUTs operating in a receive mode for each frame of images.

Figure 18:
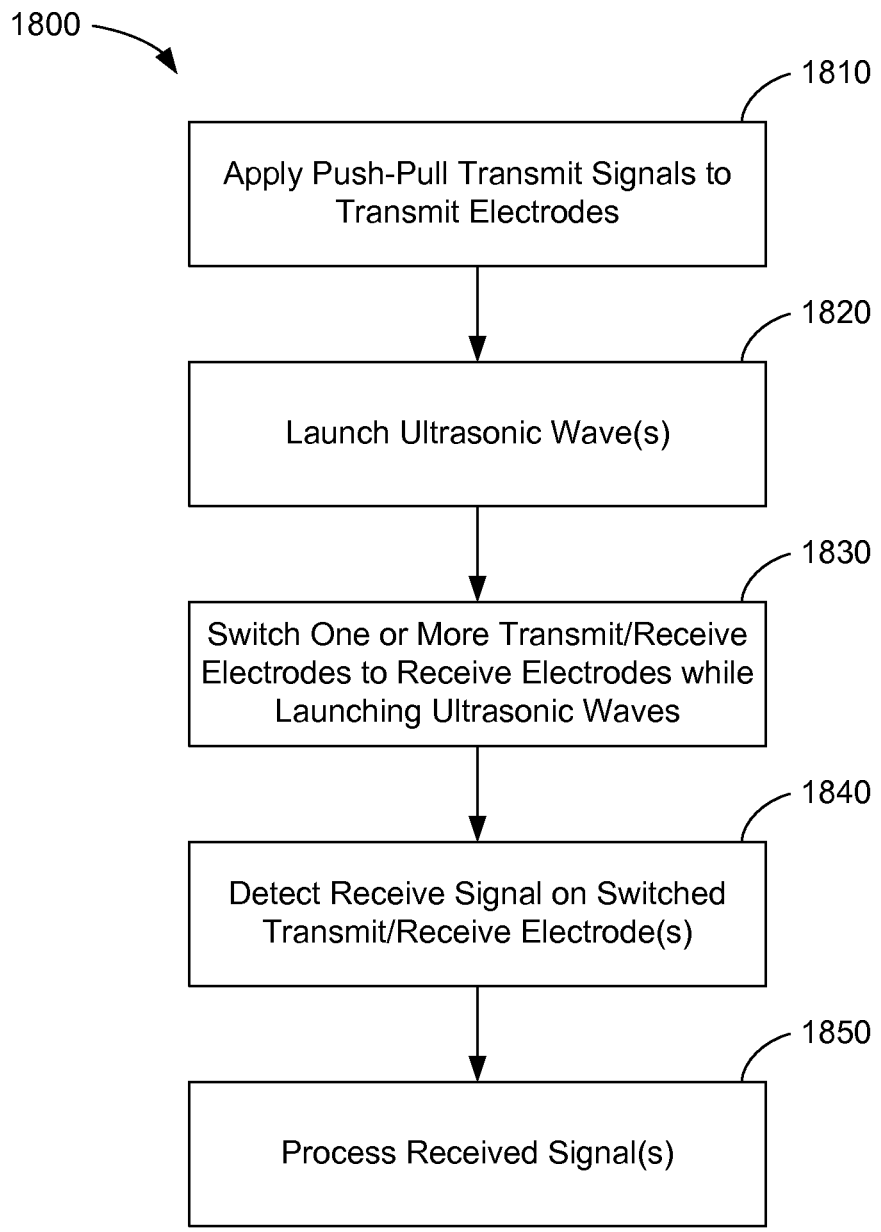
FIG. 18 illustrates a block diagram of a method for operating a PMUT sensor having at least one switchable transmit/receive electrode, according to some implementations.

FIG. 18 illustrates a block diagram of a method 1800 for operating a PMUT sensor having one or more switchable receive electrodes, according to some implementations. Differential push-pull transmit voltage signals may be applied to PMUT transmit electrodes, as shown in block 1810. Vibrations of the PMUT diaphragm may launch one or more ultrasonic waves, as shown in block 1820. One or more transmit/receive electrodes may be switched from a transmit mode to a receive mode while continuing to launch ultrasonic waves with the aid of at least one transmit electrode, as shown in block 1830. Reflected ultrasonic waves from an object may be detected by the switched PMUT transmit/receive electrodes, as shown in block 1840. The received signals may be processed, as shown in block 1850.

Figure 19:
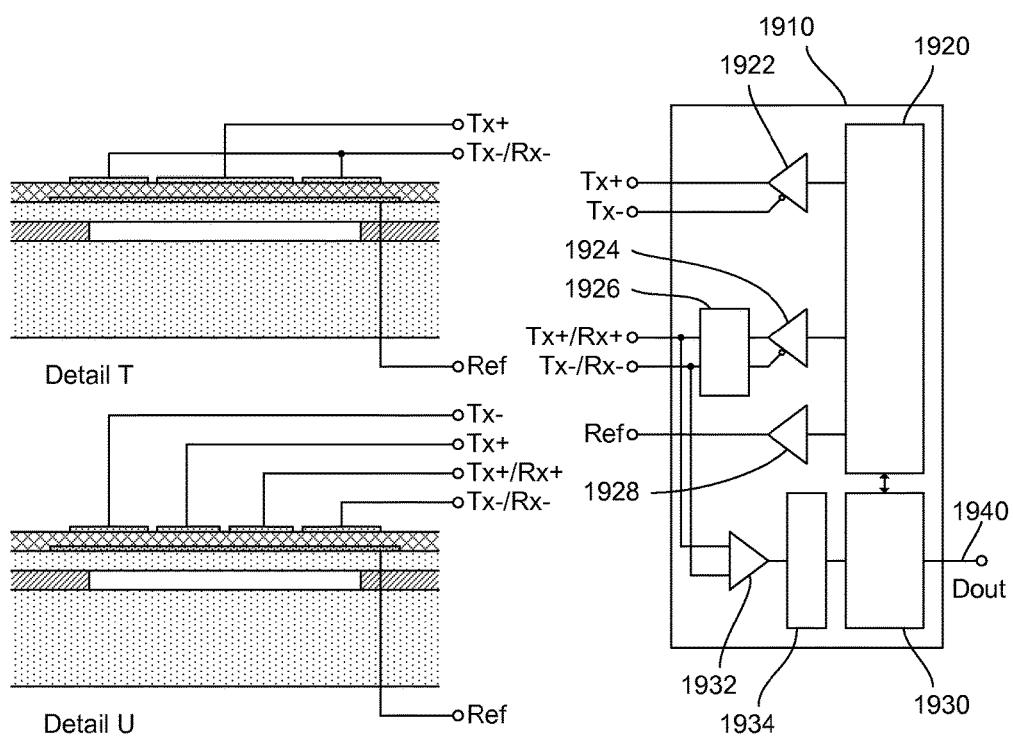
FIG. 19 illustrates a schematic diagram of transceiver circuitry and various configurations of a three-port PMUT with at least one switchable transmit/receive electrode, according to some implementations.

FIG. 19 illustrates a schematic diagram of transceiver circuitry 1910 and various configurations of a three-port PMUT with at least one switchable transmit/receive electrode, according to some implementations. Transceiver circuitry 1910 may include a control unit 1920 for generating ultrasonic waves and for receiving ultrasonic signals. Signals from the control unit 1920 may be amplified, buffered, or otherwise conditioned by a transmitter drive circuit 1922 to provide push-pull transmit signals that may be applied to the positive transmit electrode (Tx+) and negative transmit electrode (Tx−) of a three-port PMUT as applicable. Alternatively, signals from the control unit 1920 may be amplified, buffered, or otherwise conditioned with a transmitter drive circuit 1924 with a tri-state buffer 1926 or other suitable switching circuitry to provide push-pull transmit signals to one or more transmit/receive electrodes during a transmit mode and to allow one or more transmit/receive electrodes to serve as a receive electrode when switched to a receive mode. A reference electrode of a PMUT may be connected to a reference voltage level (such as ground) via a reference level drive circuit 1928. Receive signals may be amplified, buffered or otherwise conditioned with a receiver circuit 1932 and converted to a digital signal via an analog-to-digital converter (A/D) 1934 before being processed by a signal processing unit 1930. The processed signals may be provided on one or more digital output lines 1940 for further processing, such as with an applications processor of a mobile device. Detail T shows a cross-sectional view of a three-port PMUT with a center transmit electrode (Tx+) and a switchable outer transmit/receive electrode (Tx−/Rx−) along with a reference electrode (Ref) that may be connected to transceiver circuitry 1910. Note that either the inner electrode, outer electrode or both may be switchable from a transmit mode to a receive mode. Detail U shows a cross-sectional view of a three-port PMUT with a differential pair of transmit electrodes (Tx+ and Tx−) and a differential pair of receive electrodes (Rx+ and Rx−), with one or more of the transmit electrodes or receive electrodes being switchable between a transmit mode and a receive mode.

Figure 20:
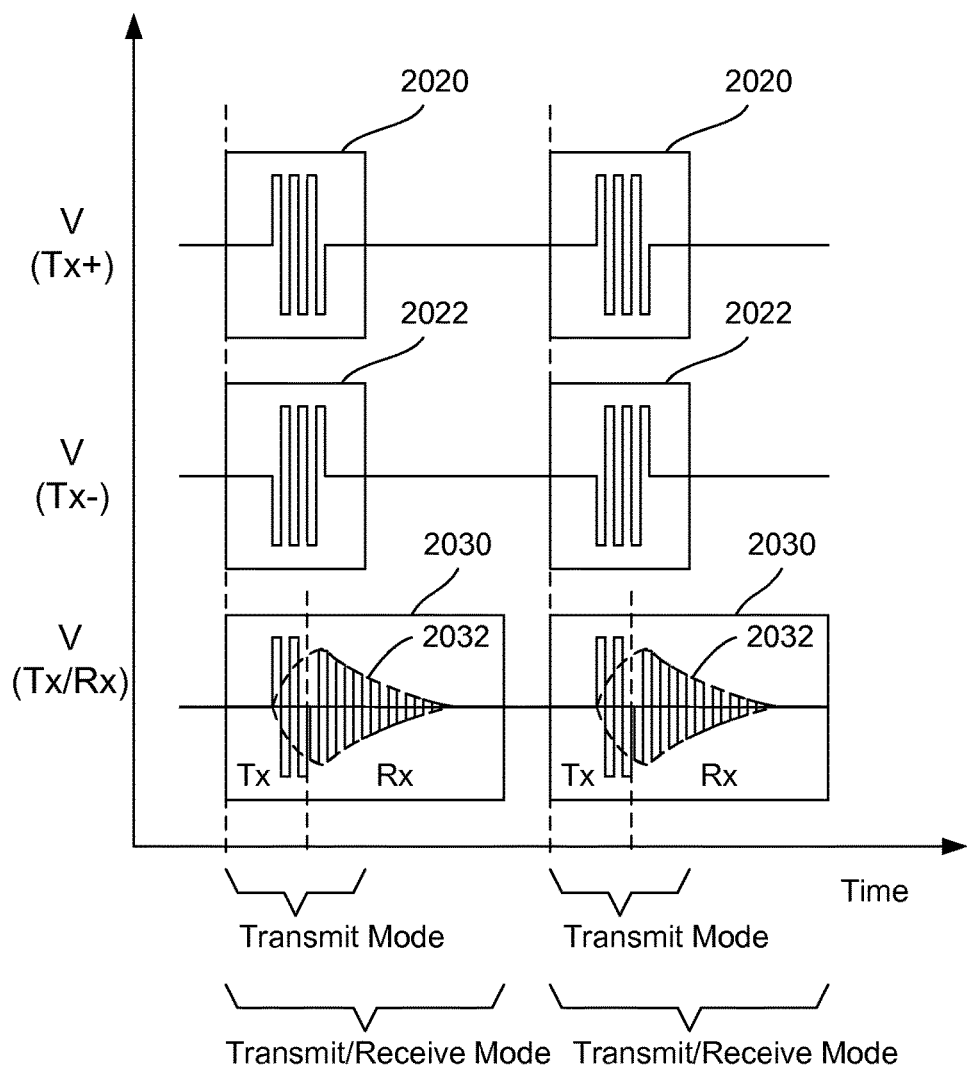
FIG. 20 illustrates a plot of push-pull transmit signals and illustrative receive signals as a function of time for a three-port PMUT with at least one switchable transmit/receive electrode, according to some implementations.

FIG. 20 illustrates a plot of push-pull transmit signals 2020, 2022 and illustrative receive signals 2030 as a function of time for a three-port PMUT with at least one switchable transmit/receive electrode, according to some implementations. When operating in a transmit mode, a pair of differential transmit signals 2020 and 2022 may be applied to a differential pair of transmit electrodes on a suitably configured three-port PMUT. Reflected signals may occur shortly after launch of the ultrasonic waves, and an illustrative receive signal 2030 within a receive signal envelope 2032 may be detected during a receive mode and processed. This process may be repeated for each PMUT, PMUT array or portion of a PMUT array as desired. Three-port PMUTs may be configured with one or more dedicated or switched transmit/receive electrodes having symmetrical or asymmetrical arrangements of transmit and receive electrodes that are inside or outside the inflection zone, with or without center release holes, with circular, square, rectangular or long rectangular diaphragms, using a variety of anchor structures.

Thus, a three-port PMUT having a ground (reference) electrode, and configured to simultaneously transmit first ultrasonic signals by way of a first electrode and to receive second ultrasonic signals by way of a second electrode has been disclosed. It will be appreciated that a number of alternative configurations and fabrication techniques may be contemplated. For example, the electrode arrangements described with respect to FIGS. 4B, 8, 9, 10, 11A-11C, 13A-13D, 14A-14D, and elsewhere in the disclosure may be used with PMUT configurations having a mechanical layer below the piezoelectric layer stack, that is, with a mechanical layer between the piezoelectric layer stack and the cavity (e.g., FIG. 4A) or with PMUT configurations having a mechanical layer above the piezoelectric layer stack, that is, with the piezoelectric layer stack between the mechanical layer and the cavity (e.g., FIG. 7). In some implementations, the piezoelectric layer stack may be formed over the anchor structure. The piezoelectric layer stack may include a piezoelectric layer such as aluminum nitride (AlN), zinc oxide (ZnO), lead-zirconate titanate (PZT) or other suitable piezoelectric material with one or more electrode layers electrically coupled to the piezoelectric layer. The piezoelectric layer stack may be patterned and etched to form vias, release holes and other features. The mechanical layer may include $SiO_2$, SiON, silicon nitride (SiN), other dielectric material, or a combination of dielectric materials or layers. In some implementations, a single AlN or PZT layer may be used as the piezoelectric layer for coupling to both transmit and receive electrodes. In some implementations, an AlN layer may be used with the transmit electrode and a PZT layer may be used with the receive electrode in the same diaphragm. In some implementations, a PZT layer may be used with the transmit electrode and an AlN layer may be used with the receive electrode in the same diaphragm. In some implementations, a piezoelectric layer of PZT and a piezoelectric layer of AlN may be substantially coplanar, that is, formed on or below the same surface of a multi-layer PMUT diaphragm. In some implementations, a two-layer stack of piezoelectric layers that are of the same or different piezoelectric material may be used to form the three-port PMUTs described above. For example, a first layer of PZT may be used with one or more transmit electrodes, and a second layer of AlN may be used with one or more receive electrodes. Transmit and receive piezoelectric layers may be above one or the other in a stacked configuration; in other implementations they may be beside one another on or in the same diaphragm. Reference electrodes may be common to one or more associated transmit or receive electrodes. One or more mechanical layers and/or electrode layers may be positioned above, below or between the various piezoelectric layers.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor or any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by or to control the operation of data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that can be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, as a person having ordinary skill in the art will readily appreciate, the terms "upper" and "lower", "top" and "bottom", "front" and "back", and "over", "overlying", "on", "under" and "underlying" are sometimes used for ease of describing the figures and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method comprising:
    transmitting, during a first time period, responsive to signals from transceiver circuitry, first ultrasonic signals by way of a first electrode of a piezoelectric micromechanical ultrasonic transducer (PMUT), the PMUT including a diaphragm disposed over a cavity, the diaphragm including a piezoelectric layer stack including a piezoelectric layer, the first electrode and a second electrode, each of the first electrode and the second electrode being electrically coupled with the transceiver circuitry; and
    receiving, during a second time period, second ultrasonic signals by way of the second electrode, wherein
    the first time period and the second time period are at least partially overlapping.

2. The method of claim 1, wherein the PMUT is configured to simultaneously transmit first ultrasonic signals by way of the first electrode and to receive second ultrasonic signals by way of the second electrode.

3. The method of claim 1, wherein:
    each of the first electrode and the second electrode is disposed on or proximate to a first surface of the piezoelectric layer, the first surface being opposite from the cavity; and
    the first electrode is disposed in an inner portion of the diaphragm and the second electrode is disposed in an outer portion of the diaphragm, the outer portion being proximal to a wall of the cavity and between the wall and the first electrode.

4. The method of claim 3, wherein a portion of the second electrode extends beyond the wall of the cavity.

5. The method of claim 3, wherein the diaphragm includes a third electrode, the third electrode being disposed between the piezoelectric layer and the cavity.

6. The method of claim 5, wherein the third electrode is configured as a reference electrode in common with each of the first electrode and the second electrode.

7. The method of claim 6, wherein a voltage of the reference electrode is clamped to ground or other reference voltage.

8. The method of claim 1, wherein:
    the diaphragm is supported by an anchor structure and extends over the cavity, the diaphragm being configured to undergo one or both of flexural motion and vibration and operate in a first flexural mode when the PMUT receives or transmits ultrasonic signals.

9. The method of claim 8, wherein, in the first flexural mode, each of the first and second electrodes experience a respective first and second oscillating load cycle that includes alternating periods of tensile and compressive stress.

10. The method of claim 9, wherein the first and second oscillating load cycles are approximately in phase.

11. The method of claim 9, wherein the first and second oscillating load cycles are out of phase.

12. The method of claim 11, wherein the first and second oscillating load cycles are 180° out of phase.

13. The method of claim 1, wherein the second electrode is configured to be in a transmit mode during the first time period and in a receive mode during the second time period.

14. An apparatus comprising:
a piezoelectric micromechanical ultrasonic transducer (PMUT), the PMUT including:
a diaphragm disposed over a cavity, the diaphragm including a piezoelectric layer stack including a piezoelectric layer, a first electrode electrically coupled with transceiver circuitry, and a second electrode electrically coupled with the transceiver circuitry, wherein:
the first electrode is disposed in a first portion of the diaphragm, and the second electrode is disposed in a second portion of the diaphragm, the first portion being separated from the first portion;
each of the first electrode and the second electrode is disposed on or proximate to a first surface of the piezoelectric layer, the first surface being opposite from the cavity; and
the PMUT is configured to transmit first ultrasonic signals by way of the first electrode during a first time period and to receive second ultrasonic signals by way of the second electrode during a second time period, the first time period and the second time period being at least partially overlapping.

15. The apparatus of claim 14, wherein the second electrode is disposed proximal to a wall of the cavity and between the wall and the first electrode.

16. The apparatus of claim 15, wherein a portion of the second electrode extends beyond the wall of the cavity.

17. The apparatus of claim 14, wherein the PMUT is configured to simultaneously transmit first ultrasonic signals by way of the first electrode and to receive second ultrasonic signals by way of the second electrode.

18. The apparatus of claim 14, wherein the diaphragm includes a third electrode, the third electrode being disposed between the piezoelectric layer and the cavity.

19. The apparatus of claim 18, wherein the first electrode is a transmit electrode, the second electrode is a receive electrode and the third electrode is configured as a reference electrode in common with each of the transmit electrode and the receive electrode.

20. The apparatus of claim 14, wherein the diaphragm includes a mechanical layer, the mechanical layer being positioned between the piezoelectric layer stack and the cavity or positioned on a side of the piezoelectric layer stack opposite the cavity.

21. The apparatus of claim 14, further comprising an anchor structure disposed over a substrate, wherein the diaphragm is supported by the anchor structure and extends over the cavity, the diaphragm being configured to undergo one or both of flexural motion and vibration when the PMUT receives or transmits ultrasonic signals.

22. The apparatus of claim 21, wherein the diaphragm is configured as an elongated rectangle having a longitudinal dimension of length L and a width of W, L being at least two times W.

23. The apparatus of claim 22, wherein the anchor structure supports the diaphragm at a first discrete location that is proximal to a proximal end of the longitudinal dimension and at a second discrete location of the diaphragm that is proximal to a distal end of the longitudinal dimension.

24. The apparatus of claim 22, wherein the anchor structure supports the diaphragm in a central portion of the diaphragm.

25. The apparatus of claim 22, wherein the anchor structure supports the diaphragm in a peripheral region of the diaphragm.

26. The apparatus of claim 21, wherein the diaphragm is substantially circular.

27. The apparatus of claim 26, wherein the anchor structure supports the diaphragm in a central portion of the diaphragm.

28. The apparatus of claim 14, wherein the cavity is formed by removing a sacrificial material through at least one release hole.

29. The apparatus of claim 28, wherein the release hole is disposed through the diaphragm.

30. The apparatus of claim 14, wherein the first electrode and the second electrode are approximately coplanar.

31. An apparatus comprising:
an array of piezoelectric micromechanical ultrasonic transducer (PMUT) sensors; and
an acoustic coupling medium, wherein:
at least one PMUT includes a diaphragm disposed over a cavity, the diaphragm including a piezoelectric layer stack including a piezoelectric layer, a first electrode electrically coupled with a transceiver circuitry, and a second electrode electrically coupled with the transceiver circuitry;
the first electrode is disposed in a first portion of the diaphragm, and the second electrode is disposed in a second portion of the diaphragm, the first portion being separated from the second portion;
each of the first electrode and the second electrode is disposed on or proximate to a first surface of the piezoelectric layer, the first surface being opposite from the cavity;
the PMUT is configured to transmit first ultrasonic signals by way of the first electrode during a first time period and to receive second ultrasonic signals by way of the second electrode during a second time period, the first time period and the second time period being at least partially overlapping;
the acoustic coupling medium is disposed above the piezoelectric layer stack; and
the PMUT is configured to receive or transmit ultrasonic signals through the acoustic coupling medium.

32. The apparatus of claim 31, wherein the array of PMUT sensors includes a platen, wherein the acoustic coupling medium is disposed between the PMUT sensors and the platen.

33. The apparatus of claim 31, wherein the PMUT is configured to simultaneously transmit first ultrasonic signals by way of the first electrode and to receive second ultrasonic signals by way of the second electrode.

34. The apparatus of claim 31, wherein the diaphragm includes a third electrode, the third electrode being disposed between the piezoelectric layer and the cavity.

35. The apparatus of claim 34, wherein the first electrode is a transmit electrode, the second electrode is a receive electrode and the third electrode is configured as a reference electrode in common with each of the transmit electrode and the receive electrode.

36. The apparatus of claim 31 wherein the array of PMUT sensors is configured as an ultrasonic fingerprint sensor array.

37. A non-transitory computer readable medium having software stored thereon, the software including instructions for causing an apparatus to:
  transmit, during a first time period, responsive to signals from transceiver circuitry, first ultrasonic signals by way of a first electrode of a piezoelectric micromechanical ultrasonic transducer (PMUT), the PMUT including a diaphragm disposed over a cavity, the diaphragm including a piezoelectric layer stack including a piezoelectric layer, the first electrode and a second electrode, each of the first electrode and the second electrode being electrically coupled with the transceiver circuitry; and
  receive, during a second time period, second ultrasonic signals by way of the second electrode, wherein the first time period and the second time period are at least partially overlapping.

38. The computer readable medium of claim 37, wherein the PMUT is configured to simultaneously transmit first ultrasonic signals by way of the first electrode and to receive second ultrasonic signals by way of the second electrode.

39. The computer readable medium of claim 37, wherein:
  each of the first electrode and the second electrode is disposed on or proximate to a first surface of the piezoelectric layer, the first surface being opposite from the cavity; and
  the first electrode is disposed in an inner portion of the diaphragm, and the second electrode is disposed in an outer portion of the diaphragm, the outer portion being proximal to a wall of the cavity, and between the wall and the first electrode.

40. The computer readable medium of claim 37, wherein the second electrode is configured to be in a transmit mode during the first time period and in a receive mode during the second time period.

\* \* \* \* \*